(12) United States Patent
Jeong et al.

(10) Patent No.: US 12,048,159 B2
(45) Date of Patent: Jul. 23, 2024

(54) THREE-DIMENSIONAL SEMICONDUCTOR MEMORY DEVICES

(71) Applicant: Samsung Electronics Co., Ltd., Suwon-si (KR)

(72) Inventors: Seong-Hun Jeong, Hwaseong-si (KR); Byoungil Lee, Hwaseong-si (KR); Joonhee Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/129,145

(22) Filed: Mar. 31, 2023

(65) Prior Publication Data

US 2023/0240074 A1 Jul. 27, 2023

Related U.S. Application Data

(63) Continuation of application No. 17/035,970, filed on Sep. 29, 2020, now Pat. No. 11,621,276.

(30) Foreign Application Priority Data

Feb. 27, 2020 (KR) .................. 10-2020-0024333

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 41/40* | (2023.01) |

(Continued)

(52) U.S. Cl.
CPC ............ *H10B 43/27* (2023.02); *H01L 23/528* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/35; H10B 43/40; H10B 41/35; H10B 43/27; H10B 41/10; H10B 41/27; H10B 41/40; H10B 43/10; H10B 43/30; H10B 43/50; H01L 23/528; H01L 29/66833; H01L 29/792
See application file for complete search history.

(56) References Cited

U.S. PATENT DOCUMENTS

| | | |
|---|---|---|
| 8,952,438 B2 | 2/2015 | Shim et al. |
| 9,508,730 B2 | 11/2016 | Lee et al. |

(Continued)

*Primary Examiner* — Galina G Yushina
(74) *Attorney, Agent, or Firm* — Myers Bigel, P.A.

(57) ABSTRACT

A semiconductor device includes a substrate including a lower horizontal layer and an upper horizontal layer and having a cell array region and a connection region, an electrode structure including electrodes, which are stacked above the substrate, and which extend from the cell array region to the connection region, a vertical channel structure on the cell array region that penetrates the electrode structure and is connected to the substrate, and a separation structure on the connection region that penetrates the electrode structure. The lower horizontal layer has a first top surface in contact with a first portion of the separation structure, and a second top surface in contact with a second portion of the separation structure, and an inflection point at which a height of the lower horizontal layer is abruptly changed between the first top surface and the second top surface.

14 Claims, 45 Drawing Sheets

(51) Int. Cl.
*H10B 43/10* (2023.01)
*H10B 43/40* (2023.01)

(56) References Cited

U.S. PATENT DOCUMENTS

| | | | |
|---|---|---|---|
| 9,780,112 | B2 | 10/2017 | Liu et al. |
| 9,870,991 | B1 | 1/2018 | Kim et al. |
| 9,985,048 | B2 | 5/2018 | Lee |
| 10,199,359 | B1 | 2/2019 | Sakakibara et al. |
| 10,354,740 | B2 | 7/2019 | Kim et al. |
| 2015/0255386 | A1* | 9/2015 | Lee .................. H10B 43/27 257/774 |
| 2017/0162591 | A1* | 6/2017 | Choi .................. H10B 43/27 |
| 2018/0308559 | A1* | 10/2018 | Kim .................. G11C 19/28 |
| 2019/0244970 | A1* | 8/2019 | Jung .................. H10B 43/35 |
| 2019/0333931 | A1* | 10/2019 | Jung .................. H01L 23/53271 |
| 2019/0393238 | A1* | 12/2019 | Lim .................. H10B 43/35 |

* cited by examiner

US 12,048,159 B2

THREE-DIMENSIONAL SEMICONDUCTOR MEMORY DEVICES

CROSS-REFERENCE TO RELATED APPLICATIONS

The present application is a continuation of, and claims priority under 35 U.S.C. § 120 to, U.S. patent application Ser. No. 17/035,970, filed Sep. 29, 2020, which, in turn, claims priority under 35 U.S.C. § 119 to Korean Patent Application No. 10-2020-0024333, filed on Feb. 27, 2020, in the Korean Intellectual Property Office, and the entire contents of above-identified applications are hereby incorporated by reference.

BACKGROUND

The present disclosure relates to semiconductor devices, and in particular to three-dimensional semiconductor memory devices with improved reliability.

There are ever-present and growing consumer demands for electronic devices that achieve higher performance and lower prices. These demands may be met in part through increasing integration of semiconductor devices used in electronic devices, since in the case of semiconductor devices, integration is an important factor in determining product prices. For two-dimensional or planar semiconductor devices, integration is determined mainly by an area occupied by a unit memory cell, and as such integration may be influenced greatly by the ability of pattern forming technology to form increasingly fine patterns. However, increasing pattern fineness requires expensive (and possibly extremely or prohibitively expensive) processing equipment, which sets a practical limitation on increasing integration for two-dimensional or planar semiconductor devices. To overcome this and other limitations, three-dimensional semiconductor memory devices including three-dimensionally arranged memory cells have recently been proposed.

SUMMARY

Example embodiments of the inventive concepts provide three-dimensional semiconductor memory devices with improved reliability.

According to some embodiments of the inventive concepts, a semiconductor memory device may include a substrate including a lower horizontal layer and an upper horizontal layer and having a cell array region and a connection region, an electrode structure including electrodes, which are stacked above the substrate, and which extend from the cell array region to the connection region, a vertical channel structure, which is on the cell array region and which penetrates the electrode structure and is connected to the substrate, and a separation structure on the connection region and which penetrates the electrode structure. The lower horizontal layer may have a first top surface in contact with a first portion of the separation structure, and a second top surface in contact with a second portion of the separation structure. The lower horizontal layer may have an inflection point, at which a height of the lower horizontal layer is abruptly changed between the first top surface and the second top surface.

According to some embodiments of the inventive concepts, a semiconductor memory device may include a substrate including a lower horizontal layer and an upper horizontal layer and having a cell array region and a connection region, an electrode structure including electrodes, which are stacked above the substrate, and which extend from the cell array region to the connection region, a vertical channel structure that penetrates the electrode structure on the cell array region and is connected to the substrate, and a dummy structure that penetrates the electrode structure on the connection region. The substrate may further include a source horizontal layer on a first region of the connection region and a lower insulating layer on a second region of the connection region. The source horizontal layer and the lower insulating layer may be interposed between the lower and upper horizontal layers. A first portion of the dummy structure may be in contact with the source horizontal layer, and a second portion of the dummy structure opposite from the first portion may be in contact with the lower insulating layer.

According to some embodiments of the inventive concepts, a semiconductor memory device may include a substrate including a lower horizontal layer and an upper horizontal layer and having a cell array region and a connection region, an electrode structure including electrodes, which are stacked above the substrate, and having a staircase structure, which has a decreasing height in a first direction, on the connection region, and a separation structure penetrating the staircase structure. The separation structure may include a first portion and a second portion, which is closer to the cell array region than the first portion. The first portion may extend from the second portion in the first direction, and a bottom surface of the first portion may be lower than a bottom surface of the second portion. The electrode structure may further include an insulating layer interposed between the upper horizontal layer and a lowermost one of the electrodes. The insulating layer that is in contact with the second portion of the separation structure may have a first thickness, and the insulating layer that is in contact with the first portion of the separation structure may have a second thickness. The second thickness may be larger than the first thickness.

BRIEF DESCRIPTION OF THE DRAWINGS

Example embodiments of the present inventive concepts will be more clearly understood from the following brief description taken in conjunction with the accompanying drawings. The accompanying drawings represent non-limiting, example embodiments as described herein.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
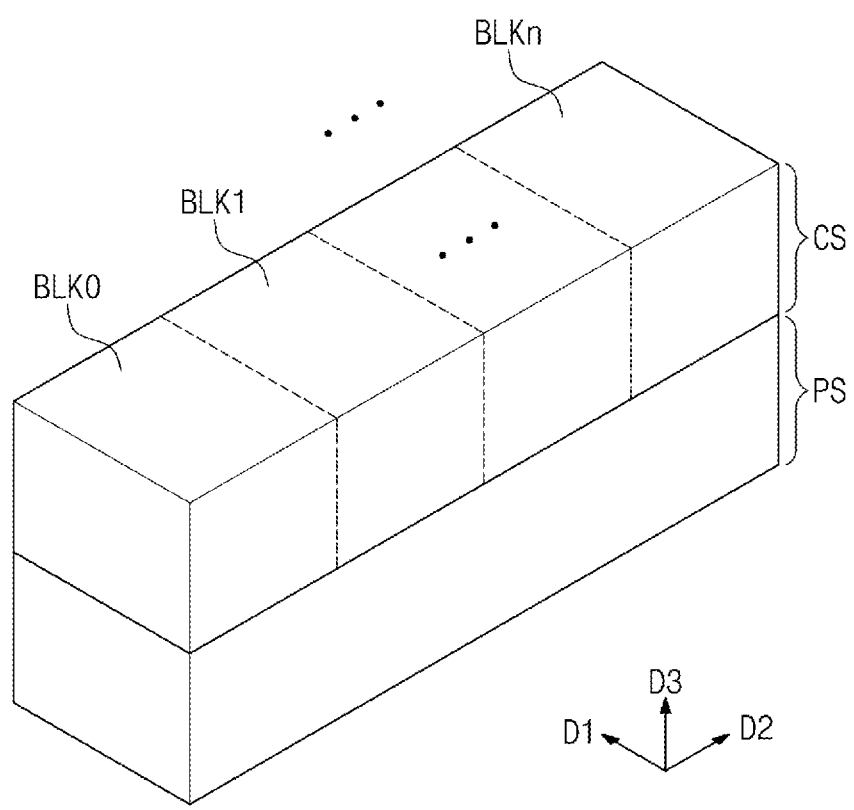
FIG. 1 is a schematic perspective view illustrating a three-dimensional semiconductor memory device according to some embodiments of the inventive concepts.

FIG. 1 is a schematic perspective view illustrating a three-dimensional semiconductor memory device according to some embodiments of the inventive concepts.

Referring to FIG. 1, a three-dimensional semiconductor memory device according to some embodiments of the inventive concepts may include a peripheral circuit structure PS, a cell array structure CS on the peripheral circuit structure PS, and penetration contacts (not shown) vertically connecting the cell array structure CS to the peripheral circuit structure PS. When viewed in a plan view, the cell array structure CS may be overlapped with the peripheral circuit structure PS or the cell array structure CS may overlap the peripheral circuit structure PS.

In some embodiments, the peripheral circuit structure PS may include row and column decoders, a page buffer, control circuits, and peripheral logic circuits. The components (e.g., peripheral logic circuits) of the peripheral circuit structure PS may be integrated on a semiconductor substrate.

The cell array structure CS may include a cell array including a plurality of memory cells, which are three-dimensionally arranged on the semiconductor substrate. For example, the cell array structure CS may include a plurality of memory blocks BLK0 to BLKn. Each of the memory blocks BLK0 to BLKn may include a plurality of memory cells, which are three-dimensionally arranged on the semiconductor substrate.

Figure 2:
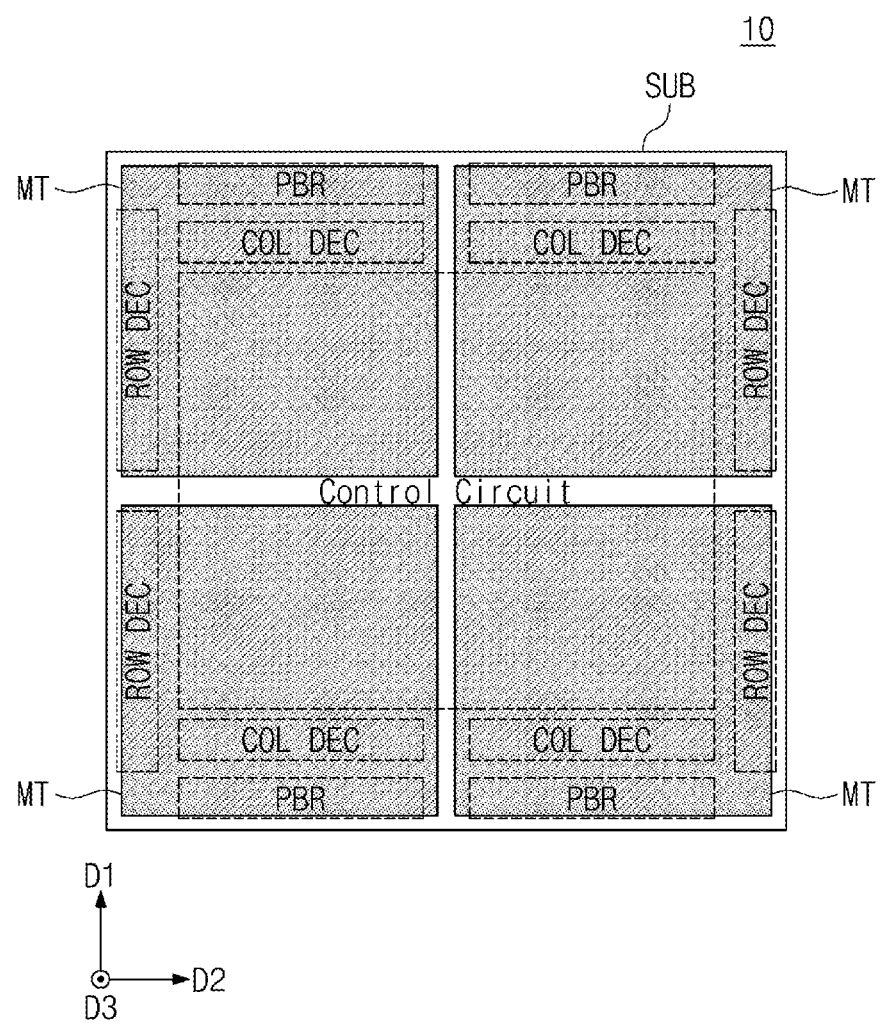
FIG. 2 is a schematic plan view illustrating a three-dimensional semiconductor memory device according to some embodiments of the inventive concepts.

FIG. 2 is a schematic plan view illustrating a three-dimensional semiconductor memory device according to some embodiments of the inventive concepts.

Referring to FIGS. 1 and 2, the peripheral circuit structure PS and the cell array structure CS described with reference to FIG. 1 may be on a first substrate SUB. For example, the semiconductor memory device may comprise one or more chip regions 10. In each of the chip regions 10, row decoders ROW DEC, column decoders COL DEC, page buffers PBR, and control circuits of the peripheral circuit structure PS (e.g., see FIG. 1) may be arranged on the first substrate SUB.

A plurality of mats MT constituting the cell array structure CS (e.g., see FIG. 1) may be on the first substrate SUB. The mats MT may be arranged in a first direction D1 and a second direction D2. In some embodiments, and as seen in FIG. 2, the mats MT may be spaced apart from each other in the first direction and in the second direction. The spacing of the mats MT in the first direction may be according to a first pitch, and the spacing of the mats MT in the second direction may be according to a second pitch, which may be the same as or different from the first pitch. Each of the mats MT may include at least one of the memory blocks BLK0 to BLKn previously described with reference to FIG. 1.

The mats MT may overlap (or be overlapped by) the peripheral circuit structure PS (e.g., see FIG. 1). According to some embodiments of the inventive concepts, the peripheral logic circuits of the peripheral circuit structure PS (e.g., see FIG. 1) may be freely arranged below the mats MT.

Figure 3:
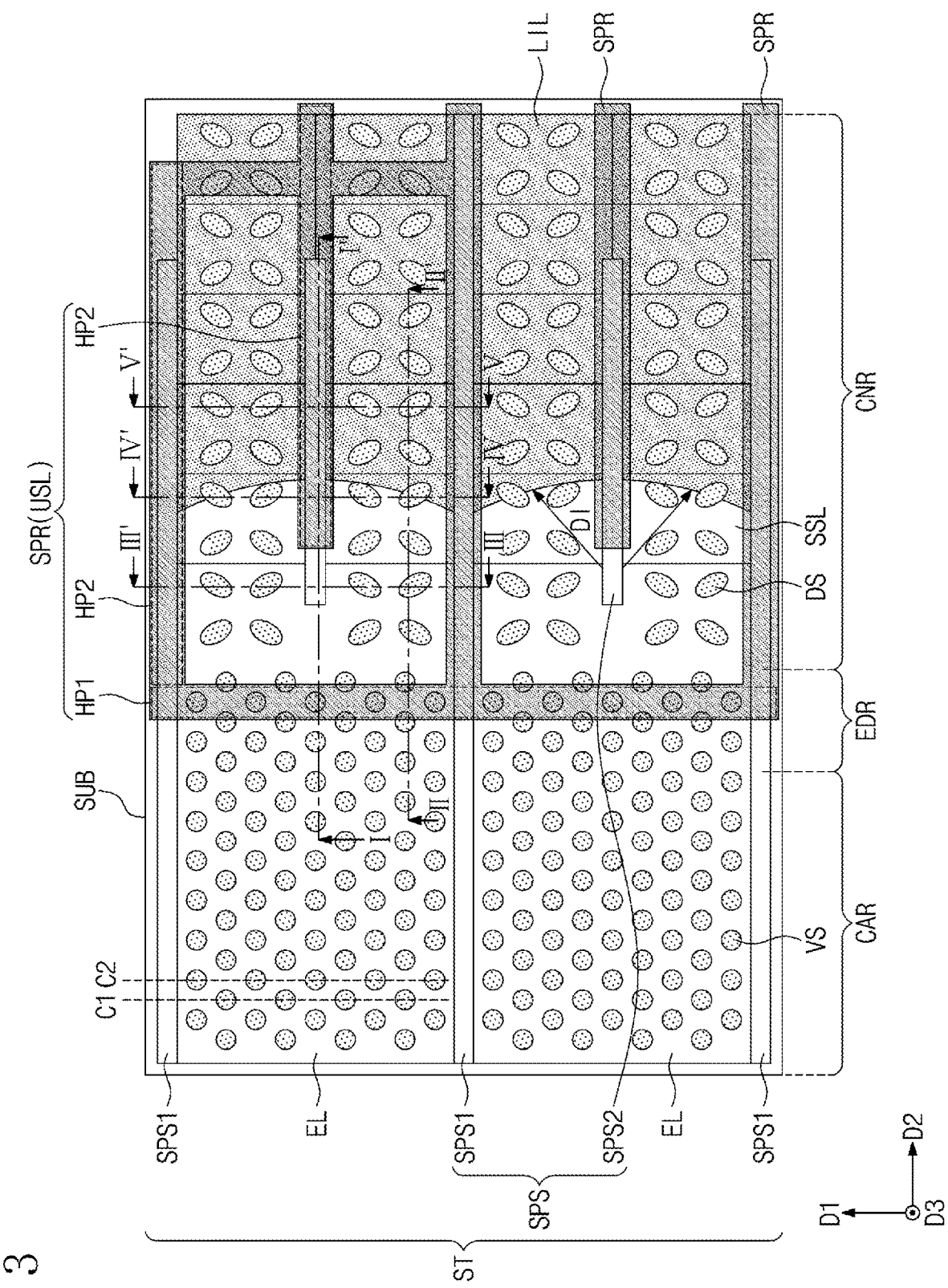
FIG. 3 is a plan view illustrating a three-dimensional semiconductor memory device according to some embodiments of the inventive concepts.

FIG. 3 is a plan view illustrating a three-dimensional semiconductor memory device according to some embodiments of the inventive concepts. FIGS. 4A, 4B, 4C, 4D, and 4E are sectional views taken along lines I-I', II-II', III-III', IV-IV', and V-V', respectively, of FIG. 3. FIG. 5 is an enlarged sectional view illustrating a portion 'M' of FIG. 4C and a portion 'N' of FIG. 4D. The semiconductor memory device shown in FIG. 3 illustrates an example of a memory cell structure provided in one of the mats MT of FIG. 2.

Referring to FIGS. 3, 4A to 4E, and 5, the peripheral circuit structure PS including peripheral transistors PTR may be arranged on the first substrate SUB. The cell array structure CS including an electrode structure ST may be disposed on the peripheral circuit structure PS. The first substrate SUB may be a silicon wafer, a silicon-germanium wafer, a germanium wafer, or a single-crystalline epitaxial layer grown on a single-crystalline silicon wafer. The first substrate SUB may include active regions defined by a device isolation layer DIL.

The peripheral circuit structure PS may include a plurality of the peripheral transistors PTR arranged on or within the active regions of the first substrate SUB. The peripheral transistors PTR may constitute the row decoders, column decoders, page buffers, control circuits, peripheral logic circuits, and so forth, as described above.

The peripheral circuit structure PS may further include lower interconnection lines INL, which is provided on the peripheral transistors PTR, and a first interlayer insulating layer ILD1 covering the peripheral transistors PTR and the lower interconnection lines INL. A peripheral contact PCNT may be provided between a lower interconnection line INL and the peripheral transistor PTR to electrically connect them. The first interlayer insulating layer ILD1 may include a plurality of stacked insulating layers. For example, the first interlayer insulating layer ILD1 may include a silicon oxide layer, a silicon nitride layer, a silicon oxynitride layer, and/or a low-k dielectric layer.

The cell array structure CS may be provided on the first interlayer insulating layer ILD1 of the peripheral circuit structure PS. Hereinafter, the cell array structure CS will be described in more detail. A second substrate SL may be provided on the first interlayer insulating layer ILD1. As an example, the second substrate SL may be a rectangular or tetragonal plate serving as a lower structure of the mat MT of FIG. 2. The second substrate SL may support the electrode structure ST provided thereon.

The second substrate SL may include a lower horizontal layer LSL, a source horizontal layer SSL, and an upper horizontal layer USL, which are sequentially stacked on the first interlayer insulating layer ILD1. Each of the lower horizontal layer LSL, the source horizontal layer SSL, and the upper horizontal layer USL may be a semiconductor layer, which is formed of or includes at least one of semiconductor materials (e.g., silicon (Si), germanium (Ge), silicon germanium (SiGe), gallium arsenic (GaAs), indium gallium arsenic (InGaAs), or aluminum gallium arsenic (AlGaAs)). Each of the lower horizontal layer LSL, the source horizontal layer SSL, and the upper horizontal layer USL may have a single-crystalline, amorphous, and/or polycrystalline structure. In some example embodiments, each of the lower horizontal layer LSL, the source horizontal layer SSL, and the upper horizontal layer USL may include an n-type doped poly-silicon layer. In some example embodiments, the lower horizontal layer LSL, the source horizontal layer SSL, and the upper horizontal layer USL may have different doping concentrations from each other.

The second substrate SL may include a cell array region CAR, a cell edge region EDR, and a connection region CNR. The cell array region CAR may be provided in a center region of the second substrate SL. The connection region CNR may be provided in a side region of the second substrate SL. The connection region CNR may extend in the second direction D2 from a side of the cell array region CAR. The cell edge region EDR may be provided outside the cell array region CAR. The cell edge region EDR may be interposed between the cell array region CAR and the connection region CNR.

Figure 4A:
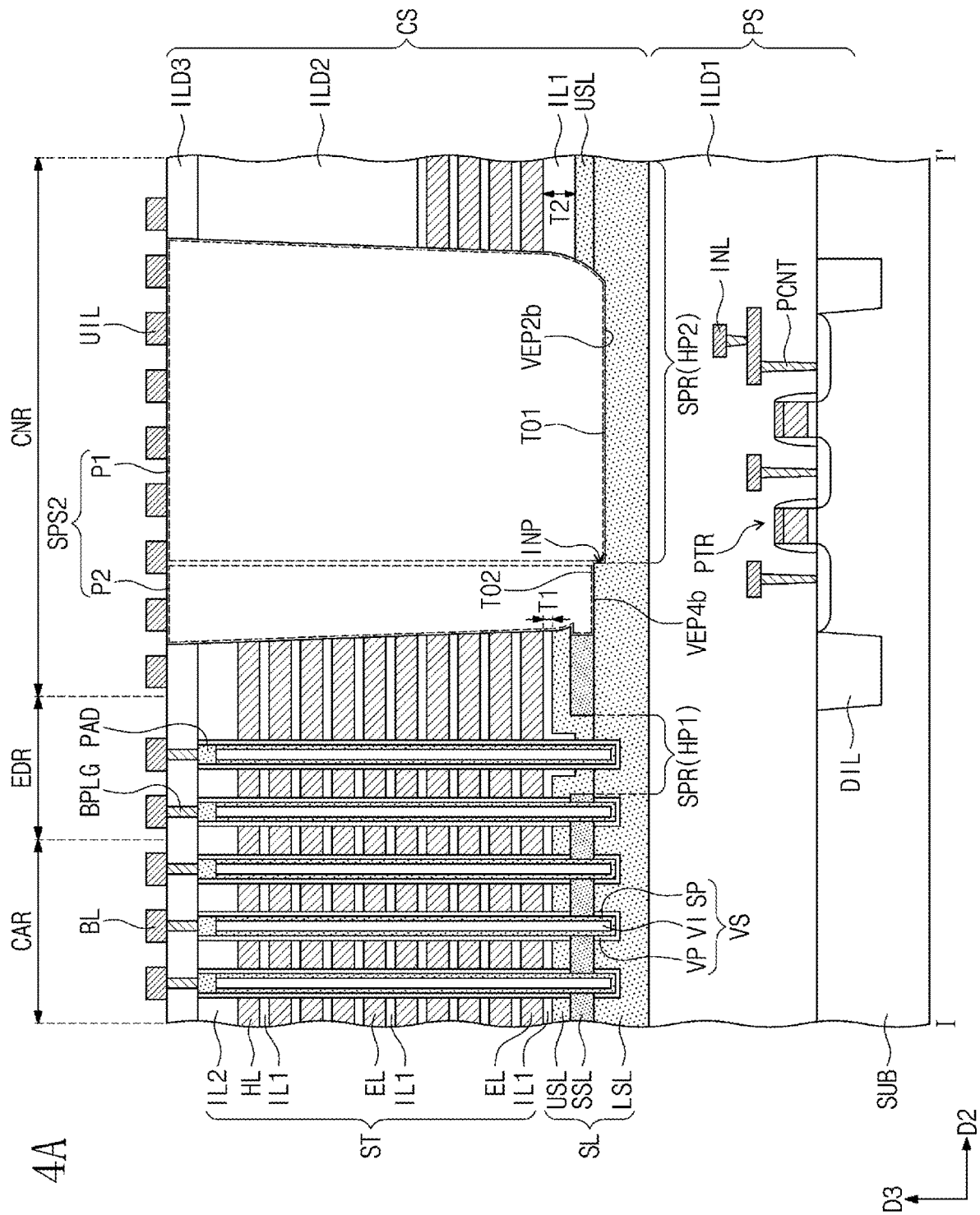
FIGS. 4A, 4B, 4C, 4D, and 4E are sectional views taken along lines I-I', II-II', III-III', IV-IV', and V-V', respectively, of FIG. 3.
Figure 4B:
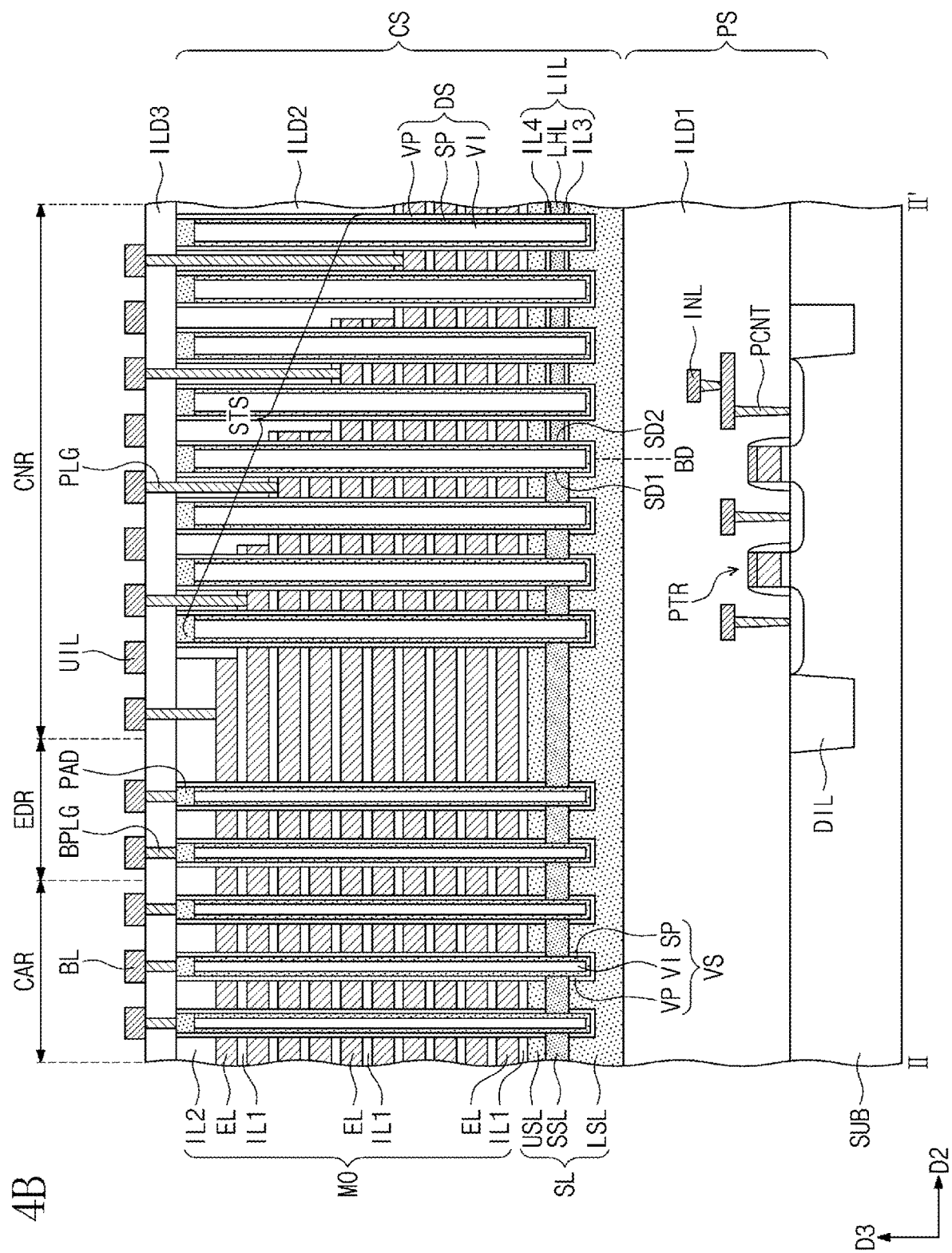
Figure 5:
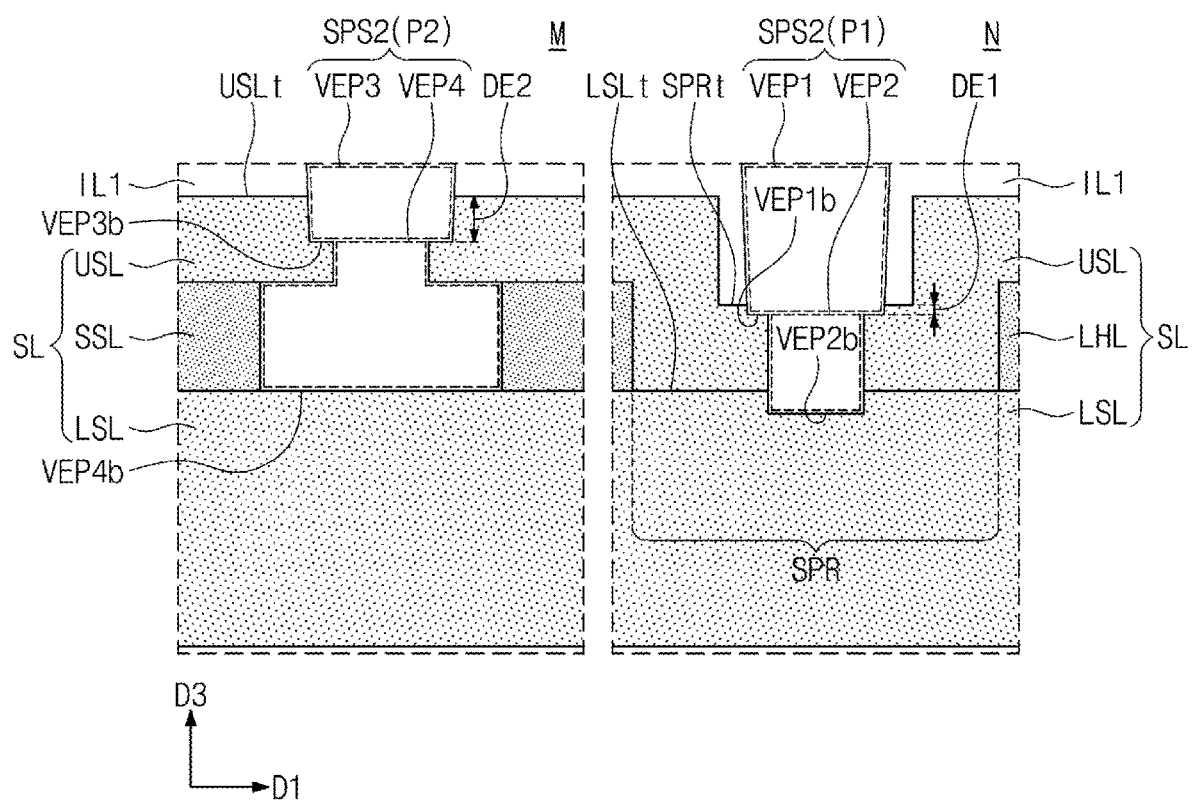
FIG. 5 is an enlarged sectional view illustrating a portion 'M' of FIG. 4C and a portion 'N' of FIG. 4D.

Referring to FIGS. 4A and 4B, on the cell array region CAR, the source horizontal layer SSL may be interposed between the lower and upper horizontal layers LSL and USL. The lower horizontal layer LSL and the upper horizontal layer USL may be electrically connected to each other through the source horizontal layer SSL.

The upper horizontal layer USL may include a supporting portion SPR. Referring to FIG. 4A, the supporting portion SPR may be a portion of the upper horizontal layer USL, which is provided to penetrate the source horizontal layer SSL and to be in direct contact with the lower horizontal layer LSL. Since the supporting portion SPR of the upper horizontal layer USL is in direct contact with the lower horizontal layer LSL, the supporting portion SPR may have high or increased physical robustness. In other words, the supporting portion SPR may serve as a bolt connecting the upper horizontal layer USL to the lower horizontal layer LSL. Due to the presence of the supporting portion SPR, the upper horizontal layer USL may support more effectively the electrode structure ST thereon. A top surface SPRt (e.g., see FIG. 5) of the supporting portion SPR may have a portion that is lower than a top surface USLt (e.g., see FIG. 5) of the upper horizontal layer USL.

Referring to FIG. 3, the supporting portion SPR may be on the cell edge region EDR and the connection region CNR. The supporting portion SPR may include a first horizontal extended portion HP1 extending in the first direction D1 and a second horizontal extended portion HP2 extending in the second direction D2. The first horizontal extended portion HP1 may be provided on the cell edge region EDR. The second horizontal extended portion HP2 may be provided on the connection region CNR.

The electrode structure ST and a second interlayer insulating layer ILD2 may be provided on the second substrate SL. The second interlayer insulating layer ILD2 may have a top surface that is coplanar with a top surface of the electrode structure ST. Referring to FIG. 4B, the second interlayer insulating layer ILD2 may cover a staircase structure STS of the electrode structure ST that is formed on the connection region CNR.

The electrode structure ST may include electrodes EL, which are stacked in a direction (i.e., a third direction D3) normal to a top surface of the second substrate SL. The electrode structure ST may further include first insulating layers IL1 vertically separating the stacked electrodes EL from each other. The first insulating layers IL1 and the electrodes EL of the electrode structure ST may be alternately stacked in the third direction D3. A second insulating layer IL2 may be provided as the topmost layer of the electrode structure ST. The second insulating layer IL2 may be thicker than each of the first insulating layers IL1.

Referring to FIG. 4B, the electrode structure ST may extend from the cell array region CAR to the connection region CNR. The electrode structure ST may have the staircase structure STS on the connection region CNR. A height of the staircase structure STS of the electrode structure ST may decrease with increasing distance from the cell array region CAR. Within the staircase structure STS, an upper surface of each electrode EL of the electrode structure ST may be exposed for connection thereto. A first electrode EL of the electrode structure ST may not extend as far in the second direction as a second electrode EL of the electrode structure that is below (e.g., closer to the substrate SUB) the first electrode EL. In other words, the height of the staircase structure STS of the electrode structure ST may have the highest value near the cell array region CAR and may decrease in the second direction D2.

A lowermost one of the electrodes EL of the electrode structure ST may serve as a lower selection line. A topmost or uppermost one of the electrodes EL of the electrode structure ST may serve as an upper selection line. The remaining electrodes EL, that is, the electrodes EL other than those used for the lower and upper selection lines, may serve as word lines.

Each of the electrodes EL may be formed of or include a conductive material that is selected from a group including at least doped semiconductor materials (e.g., doped silicon), metals (e.g., tungsten, copper, or aluminum), conductive metal nitrides (e.g., titanium nitride or tantalum nitride), and transition metals (e.g., titanium or tantalum). Each of the first and second insulating layers IL1 and IL2 may include a silicon oxide layer.

A plurality of vertical channel structures VS may be provided on the cell array region CAR and the cell edge region EDR to penetrate the electrode structure ST. The vertical channel structures VS may be arranged in columns. For example, as shown in FIG. 3, four vertical channel structures VS may be arranged in the first direction D1 to form a first column C1, and five vertical channel structures VS may be arranged in the first direction D1 to form a second column C2. The number of vertical channel structures VS within each column is merely an example and the present disclosure is not limited thereto. The first and second columns C1 and C2 may be repeatedly and alternately arranged in the second direction D2. In an embodiment, a diameter of each of the vertical channel structures VS may gradually decrease with decreasing distance from the first substrate SUB.

Dummy structures DS may be provided on the connection region CNR to penetrate the electrode structure ST. The dummy structures DS may penetrate the staircase structure STS of the electrode structure ST. When viewed in a plan view (e.g., as seen in FIG. 3), a size (e.g., a diameter) of each of the dummy structures DS may be larger than a size (e.g., a diameter) of each of the vertical channel structures VS.

Each of the vertical channel structures VS may include a vertical insulating pattern VP, a vertical semiconductor pattern SP, and an insulating gap-fill pattern VI. The vertical semiconductor pattern SP may be interposed between the vertical insulating pattern VP and the insulating gap-fill pattern VI. A conductive pad PAD may be provided on each of the vertical channel structures VS.

The insulating gap-fill pattern VI may be shaped like a circular pillar. The vertical semiconductor pattern SP may cover an outer surface of the insulating gap-fill pattern VI and may extend from the lower horizontal layer LSL to the conductive pad PAD in the third direction D3. The vertical semiconductor pattern SP may be shaped like a pipe with an open top end and a closed bottom end. The vertical insulating pattern VP may cover an outer surface of the vertical semiconductor pattern SP and may extend from the lower horizontal layer LSL to a top surface of the second insulating layer IL2 in the third direction D3. The vertical insulating pattern VP may also be shaped like a pipe with an open top end and a closed bottom end. The vertical insulating pattern VS may extend along sidewalls of the conductive pad PAD. The vertical insulating pattern VP may be interposed between the electrodes EL of the electrode structure ST and the vertical semiconductor pattern SP.

The vertical insulating pattern VP may be composed of a single layer or a plurality of layers. In some example embodiments, the vertical insulating pattern VP may include a data storing layer. For example, the vertical insulating pattern VP may include a tunnel insulating layer, a charge storing layer, and a blocking insulating layer, which are used as the data storing layer of the NAND FLASH memory device.

In some example embodiments, the charge storing layer may be a trap insulating layer, a floating gate electrode, or an insulating layer with conductive nano dots, as examples. In some example embodiments, the charge storing layer may include at least one of a silicon nitride layer, a silicon oxynitride layer, a silicon-rich nitride layer, a nanocrystalline silicon layer, or a laminated trap layer. The tunnel insulating layer may be formed of or include at least one of materials whose band gaps are greater than that of the charge storing layer. The tunnel insulating layer may be formed of or include silicon oxide. The blocking insulating layer may be formed of or include at least one of high-k dielectric materials (e.g., aluminum oxide and hafnium oxide) or silicon oxide.

The vertical semiconductor pattern SP may be formed of or include at least one of semiconductor materials (e.g., silicon (Si), germanium (Ge) and silicon germanium (SiGe)). In some example embodiments, the vertical semiconductor pattern SP may be a doped or intrinsic semiconductor pattern. Since the vertical semiconductor pattern SP is formed of or includes a semiconductor material, the vertical semiconductor pattern SP may be used as channel regions of transistors constituting a NAND cell string.

The conductive pad PAD may cover a top surface of the vertical semiconductor pattern SP and a top surface of the insulating gap-fill pattern VI. The conductive pad PAD may be formed of or include at least one of doped semiconductor materials and/or conductive materials. A bit line contact plug BPLG may be electrically connected to the vertical semiconductor pattern SP through the conductive pad PAD.

The source horizontal layer SSL on the cell array region CAR may be in direct contact with a lower side surface of each of the vertical semiconductor patterns SP. The source horizontal layer SSL may electrically connect the vertical semiconductor patterns SP which are on or within the cell array region CAR to each other. That is, the vertical semiconductor patterns SP of the vertical channel structures VS may be electrically connected in common to the second substrate SL. The second substrate SL may serve as a source electrode of memory cells. A common source voltage may be applied to the second substrate SL.

Each of the dummy structures DS may include the vertical insulating pattern VP, the vertical semiconductor pattern SP, and the insulating gap-fill pattern VI, as previously described with reference to the vertical channel structures VS. However, the dummy structures DS may not serve as the channel of the memory cell, unlike the vertical channel structures VS. The dummy structures DS may be electrically disconnected from bit lines BL and upper interconnection lines UIL, which will be described further below. In other words, the dummy structures DS may be dummy patterns, which do not have any function in terms of circuitry. The dummy structures DS may serve as pillars mechanically supporting the staircase structure STS of the electrode structure ST.

Figure 4C:
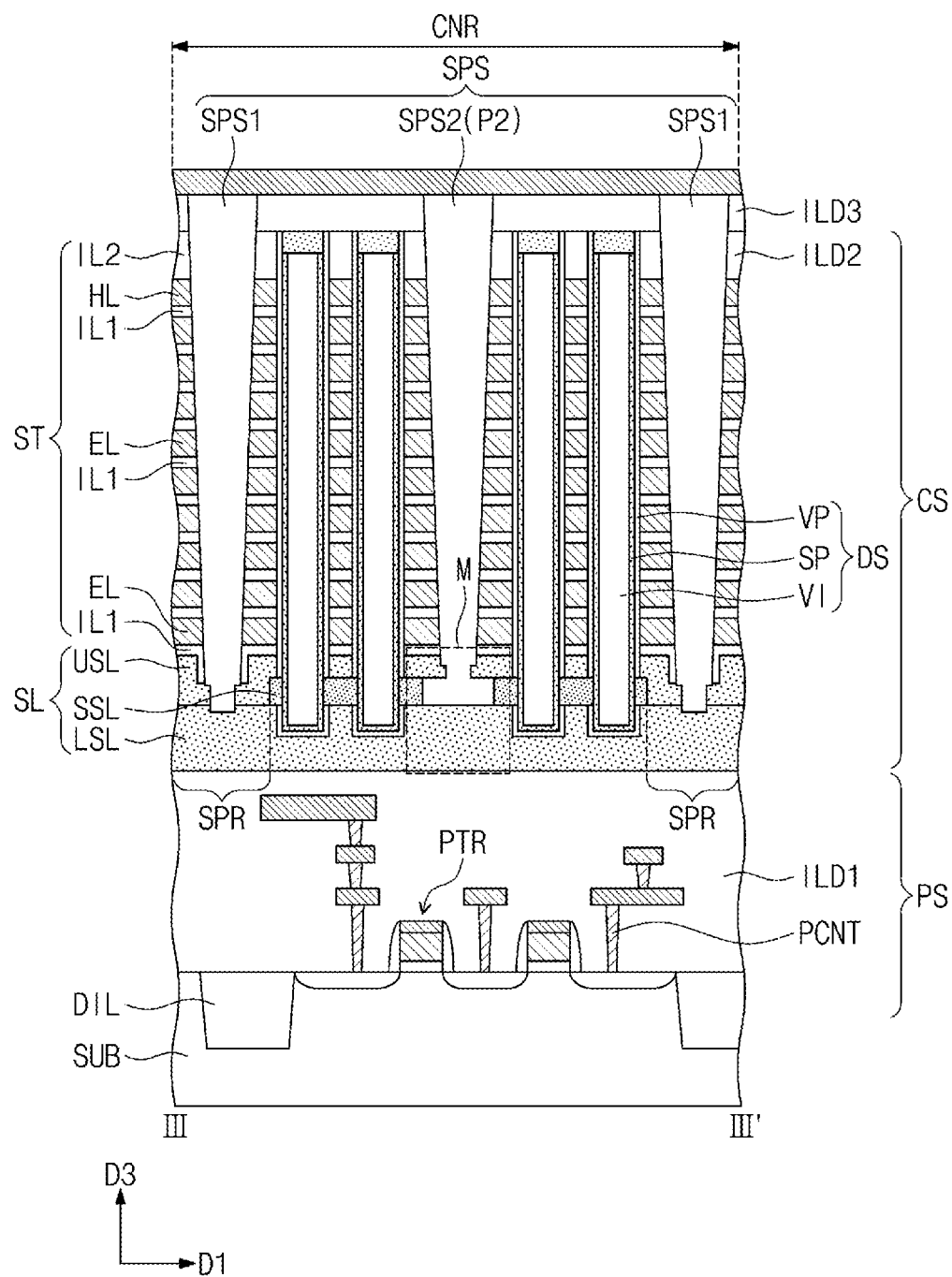

A plurality of separation structures SPS may be provided to penetrate the electrode structure ST. The separation structures SPS may extend in the second direction D2 and in parallel to each other. When viewed in a plan view, each of the separation structures SPS may be a line- or bar-shaped pattern extending in the second direction D2. The separation structures SPS may be spaced apart from each other in the first direction D1. Referring to FIG. 4C, due to the separation structures SPS, each electrode EL may be horizontally divided into a plurality of the electrodes EL. The separation structures SPS may be formed of or include an insulating material, such as silicon oxide.

The separation structures SPS may include first separation structures SPS1, which may extend from the cell array region CAR to the connection region CNR, and second separation structures SPS2, which are provided on the connection region CNR and may not extend to the cell array region CAR.

Referring to FIGS. 3 and 4A, the second separation structure SPS2 may include a first portion P1, which is overlapped with the supporting portion SPR, and a second portion P2, which is not overlapped with the supporting portion SPR. The first portion P1 may be overlapped with the second horizontal extended portion HP2. In other words, the first portion P1 may extend along the second horizontal extended portion HP2 and in the second direction D2. The connection region CNR may have a region that is not overlapped with the supporting portion SPR. The second portion P2 may be overlapped with the region of the connection region CNR. When viewed in a plan view, the second portion P2 may be spaced apart from the second horizontal extended portion HP2.

Figure 4D:
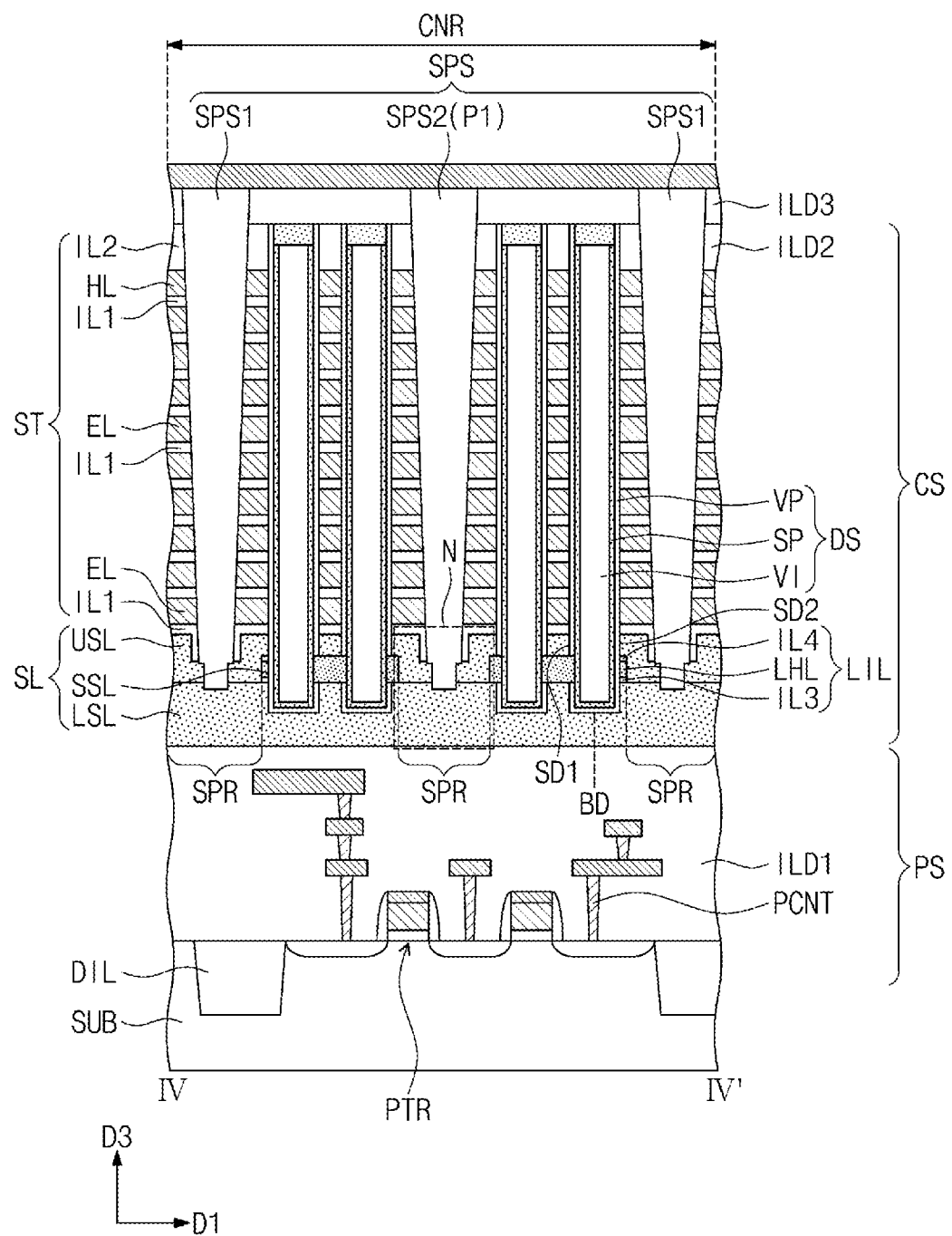

Referring to FIGS. 4D and 5, the first portion P1 of the second separation structure SPS2 may include a first vertical extended portion VEP1 and a second vertical extended portion VEP2 under the first vertical extended portion VEP1. The second vertical extended portion VEP2 may extend from a bottom surface VEP1b of the first vertical extended portion VEP1 toward the lower horizontal layer LSL. The bottom surface VEP1b of the first vertical extended portion VEP1 may be lower than the top surface SPRt of the supporting portion SPR by a first depth DE1.

A width of the second vertical extended portion VEP2 in the first direction D1 may be smaller than or less than a width of the first vertical extended portion VEP1 in the first direction D1. A width of the second separation structure SPS2 in the first direction D1 may be abruptly reduced at an inflection point near a border between the first vertical extended portion VEP1 and the second vertical extended portion VEP2.

The second vertical extended portion VEP2 may be provided to penetrate the supporting portion SPR of the upper horizontal layer USL and may extend into the lower horizontal layer LSL. A bottom surface VEP2b of the second vertical extended portion VEP2 may be lower than a top surface LSLt of the lower horizontal layer LSL.

Referring to FIGS. 4C and 5, the second portion P2 of the second separation structure SPS2 may include a third vertical extended portion VEP3 and a fourth vertical extended portion VEP4 under the third vertical extended portion VEP3. The fourth vertical extended portion VEP4 may extend from a bottom surface VEP3b of the third vertical extended portion VEP3 toward the lower horizontal layer LSL. The bottom surface VEP3b of the third vertical extended portion VEP3 may be lower than the top surface USLt of the upper horizontal layer USL by a second depth DE2. The second depth DE2 may be larger than the first depth DE1.

In the source horizontal layer SSL, the fourth vertical extended portion VEP4 may be horizontally expanded. A bottom surface VEP4b of the fourth vertical extended portion VEP4 may be substantially coplanar with a bottom surface of the source horizontal layer SSL. The bottom surface VEP4b of the fourth vertical extended portion VEP4 may be located at substantially the same level as the top surface LSLt of the lower horizontal layer LSL.

Referring to FIG. 4A, the first portion P1 of the second separation structure SPS2 may extend from the second portion P2 in the second direction D2. The bottom surface VEP2b of the first portion P1 may be lower than the bottom surface VEP4b of the second portion P2. A level of a bottom surface of the second separation structure SPS2 may be abruptly changed near a border between the first portion P1 and the second portion P2.

The lower horizontal layer LSL may have a first top surface TO1 and a second top surface TO2, which are in contact with the first portion P1 and the second portion P2, respectively. The first top surface TO1 may be lower than the second top surface TO2. The lower horizontal layer LSL may have an inflection point INP, at which a height of the lower horizontal layer LSL is abruptly changed, between the first top surface TO1 and the second top surface TO2. The inflection point INP may correspond to the afore-described border, at which a level of the bottom surface of the second separation structure SPS2 is abruptly changed.

The lowermost one of the first insulating layers IL1 of the electrode structure ST may have a varying thickness (e.g., at least two different thicknesses). The lowermost one of the first insulating layers IL1 may be a layer that is interposed between the upper horizontal layer USL and the lowermost one of the electrodes EL of the electrode structure ST. For example, the lowermost one of the first insulating layers IL1, which is in contact with a first side of the second separation structure and/or a side of a first portion (e.g., the second portion P2) of the second separation structure SPS2 may have a first thickness T1. The lowermost one of the first insulating layers IL1, which is in contact with a second side of the second separation structure SPS2 opposite from the first side and/or a side of a second portion (e.g., the first portion P1) of the second separation structure SPS2, may have a second thickness T2. The second thickness T2 may be larger than the first thickness T1.

The first separation structure SPS1 on the connection region CNR may be vertically overlapped with the supporting portion SPR, like the first portion P1 of the second separation structure SPS2 described above. In some example embodiments, the first separation structure SPS1 on the connection region CNR may not include any portion corresponding to the second portion P2 of the second separation structure SPS2 described above.

Referring to FIGS. 3 and 4B, a lower insulating layer LIL may be provided on the connection region CNR. The lower insulating layer LIL may be provided at the same level as the source horizontal layer SSL. For example, a bottom surface of the lower insulating layer LIL may be substantially coplanar with the bottom surface of the source horizontal layer SSL, and a top surface of the lower insulating layer LIL may be substantially coplanar with the top surface of the source horizontal layer SSL.

The second substrate SL on the connection region CNR may include a first region, which is located near to the cell array region CAR and is provided with the source horizontal layer SSL, and a second region, which is located opposite to the cell array region CAR and is provided with the lower insulating layer LIL.

Referring to FIG. 3, the lower insulating layer LIL may be spaced apart from the second portion P2 of the second separation structure SPS2 by a distance DI. When viewed in a plan view, a border BD between the source horizontal layer SSL and the lower insulating layer LIL may have a curved profile.

The lower insulating layer LIL may include a third insulating layer IL3, a lower sacrificial layer LHL, and a fourth insulating layer IL4, which are sequentially stacked. In an embodiment, the third and fourth insulating layers IL3 and IL4 may be formed of or include silicon oxide, and the lower sacrificial layer LHL may be formed of or include at least one of silicon nitride or silicon oxynitride.

Referring to FIGS. 3, 4B, and 4D, at least one dummy structure DS may be provided on the border BD between the source horizontal layer SSL and the lower insulating layer LIL. A side portion SD1 of the dummy structure DS may be in contact with the source horizontal layer SSL, and an opposite side portion SD2 of the dummy structure DS may be in contact with the lower insulating layer LIL. The source horizontal layer SSL, which is in contact with the side portion SD1 of the dummy structure DS, may be connected to the vertical semiconductor pattern SP of the dummy structure DS. The lower insulating layer LIL, which is in contact with the opposite side portion SD2 of the dummy structure DS, may be connected to the vertical insulating pattern VP of the dummy structure DS. The lower insulating layer LIL may be interposed between the opposite side portion SD2 of the dummy structure DS and the supporting portion SPR. The source horizontal layer SSL may be interposed between the side portion SD1 of the dummy structure DS and another dummy structure DS, which is adjacent to the dummy structure DS.

Figure 4E:
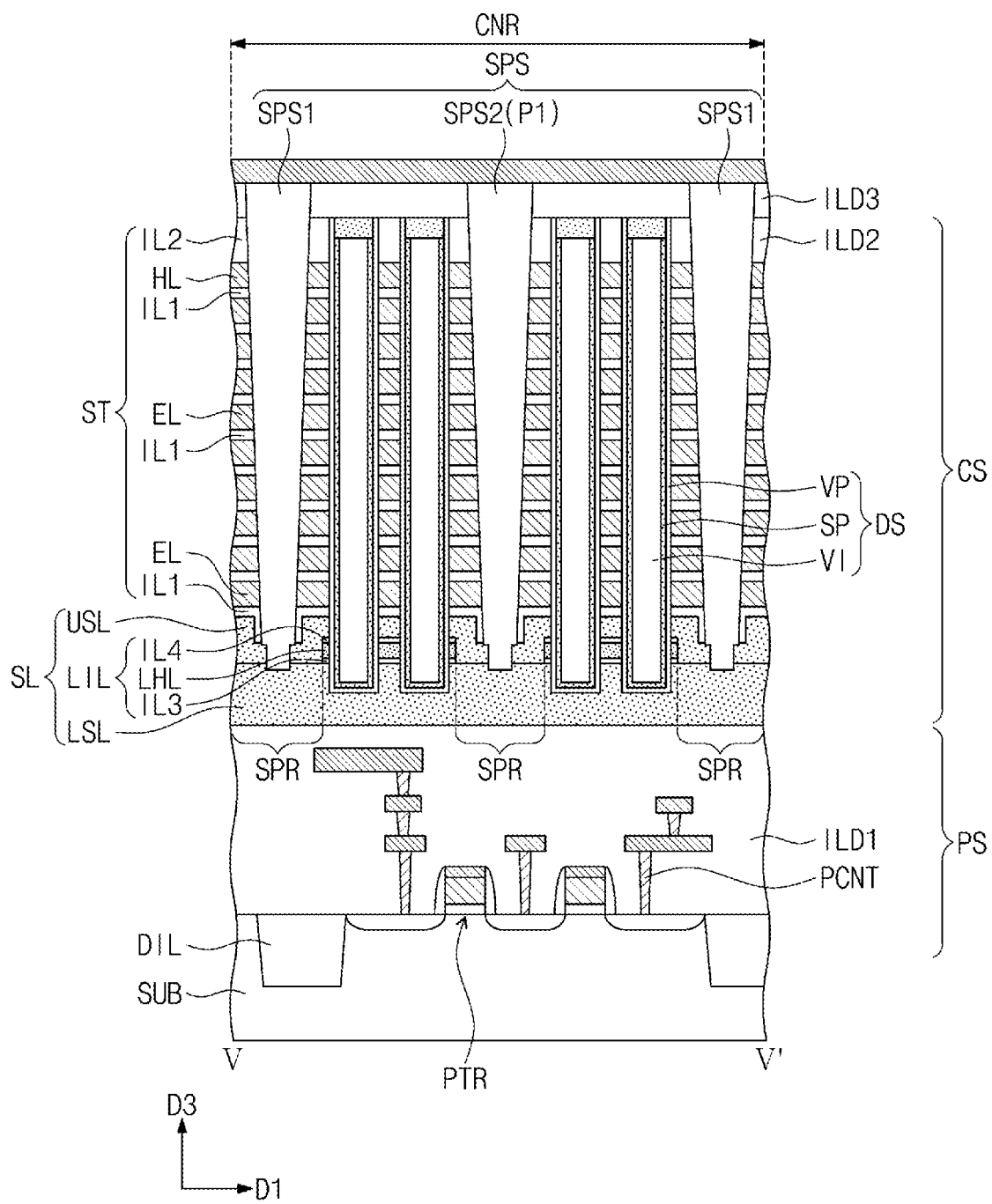

Referring to FIGS. 4C and 4E, the dummy structures DS may include a first dummy structure, which is adjacent to the first portion P1 of the second separation structure SPS2, and a second dummy structure, which is adjacent to the second portion P2 of the second separation structure SPS2. The lower insulating layer LIL may be interposed between the first portion P1 and the first dummy structure (e.g., see FIG. 4E). The source horizontal layer SSL may be interposed between the second portion P2 and the second dummy structure (e.g., see FIG. 4C). In other words, referring to FIG. 3, the lower insulating layer LIL may be provided around the first portion P1, and the source horizontal layer SSL may be provided around the second portion P2. This may be because the source horizontal layer SSL is formed through the second portion P2 of the second separation structure SPS2.

A three-dimensional semiconductor memory device according to some example embodiments of the inventive concepts may be a three-dimensional NAND FLASH memory device. The NAND cell strings of the NAND FLASH memory device may be integrated on the second substrate SL and in the electrode structure ST. For example, the electrode structure ST and the vertical channel structures VS penetrating the same may be components of memory cells, which are three-dimensionally arranged on the second substrate SL. The electrodes EL of the electrode structure ST may be used as gate electrodes of transistors.

A third interlayer insulating layer ILD3 may be provided on the second interlayer insulating layer ILD2. The bit line contact plugs BPLG may be provided to penetrate the third interlayer insulating layer ILD3 and may be coupled to respective conductive pads PAD. The bit lines BL may be disposed on the third interlayer insulating layer ILD3. The bit lines BL may extend in the first direction D1 and parallel to each other. The bit lines BL may be electrically connected to the vertical channel structures VS, respectively, through the bit line contact plugs BPLG.

Cell contact plugs PLG may penetrate the second and third interlayer insulating layers ILD2 and ILD3 and may be coupled to respective electrodes EL within the staircase structure STS. The upper interconnection lines UIL may be on the third interlayer insulating layer ILD3. The upper interconnection lines UIL may be electrically connected to the electrodes EL, respectively, through the cell contact plugs PLG.

Although not shown, the bit lines BL and the upper interconnection lines UIL may be electrically connected to the lower interconnection lines INL of the peripheral circuit structure PS through the penetration contacts.

According to some example embodiments of the inventive concepts, the supporting portion SPR of the source horizontal layer SSL may improve the structural stability of the second substrate SL. Meanwhile, since at least a portion (e.g., the second portion P2) of the second separation structure SPS2 is not overlapped with the supporting portion SPR, it may be possible to prevent a process failure (e.g., cavities formed below the electrode structure ST) from occurring. Thus, according to the present disclosure, it may be possible to improve the structural stability and reliability of a semiconductor memory device.

FIGS. 6A, 7A, 8A, 9A, 10A, and 11A are sectional views, which are taken along the line I-I' of FIG. 3 to illustrate some aspects of methods of fabricating three-dimensional semiconductor memory devices, according to some embodiments of the inventive concepts. FIGS. 7B, 8B, 9B, 10B, and 11B are sectional views, which are taken along the line II-II' of FIG. 3 to illustrate some aspects of methods of fabricating three-dimensional semiconductor memory devices, according to some embodiments of the inventive concepts. FIGS. 6B, 7C, 8C, 9C, 10C, and 11C are sectional views, which are taken along the line III-III' of FIG. 3 to illustrate some aspects of methods of fabricating three-dimensional semiconductor memory devices, according to some embodiments of the inventive concepts. FIGS. 7D, 8D, 9D, 10D, and 11D are sectional views, which are taken along the line IV-IV' of FIG. 3 to illustrate some aspects of methods of fabricating three-dimensional semiconductor memory devices, according to some embodiments of the inventive concepts.

Figure 6A:
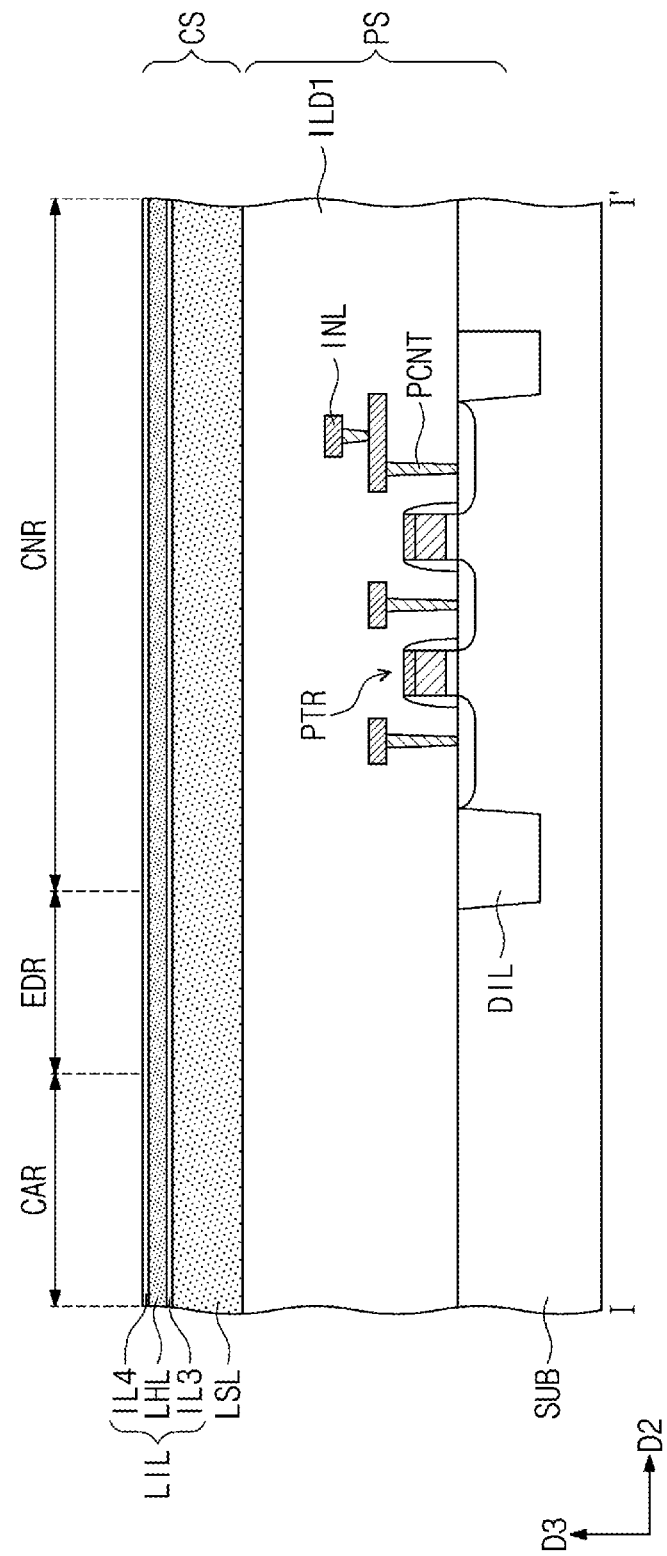
FIGS. 6A, 7A, 8A, 9A, 10A, and 11A are sectional views, which are taken along the line I-I' of FIG. 3 to illustrate some aspects of methods of fabricating three-dimensional semiconductor memory devices, according to some embodiments of the inventive concepts.
Figure 6B:
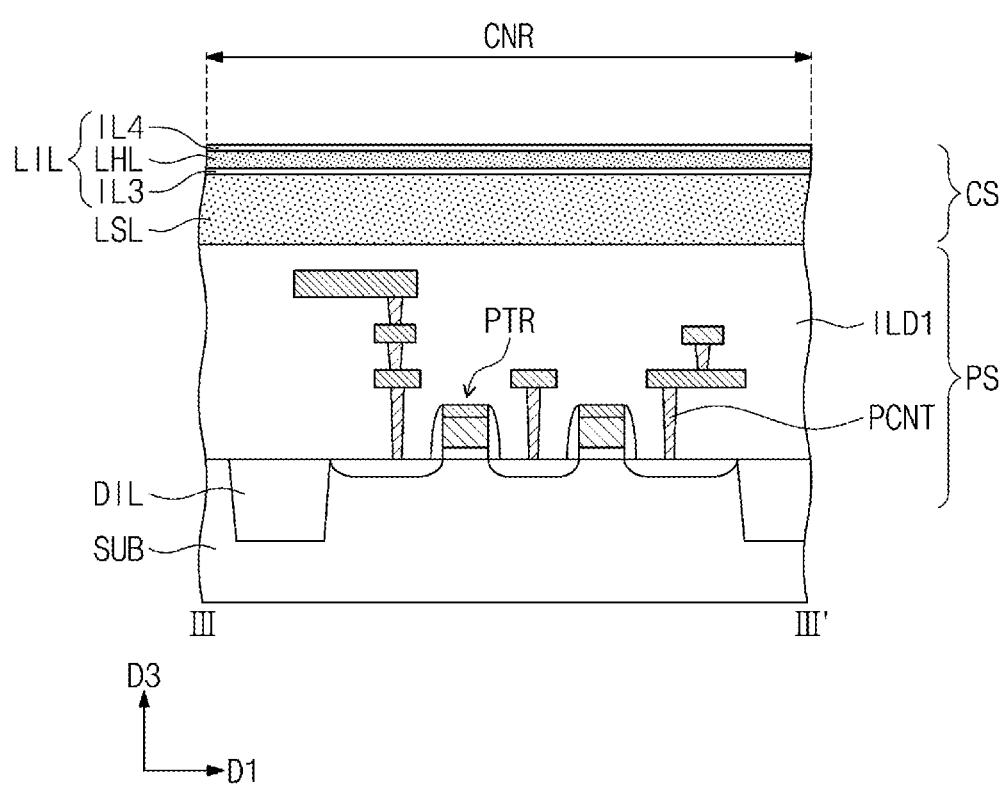
FIGS. 6B, 7C, 8C, 9C, 10C, and 11C are sectional views, which are taken along the line III-III' of FIG. 3 to illustrate some aspects of methods of fabricating three-dimensional semiconductor memory devices, according to some embodiments of the inventive concepts.
Figure 7A:
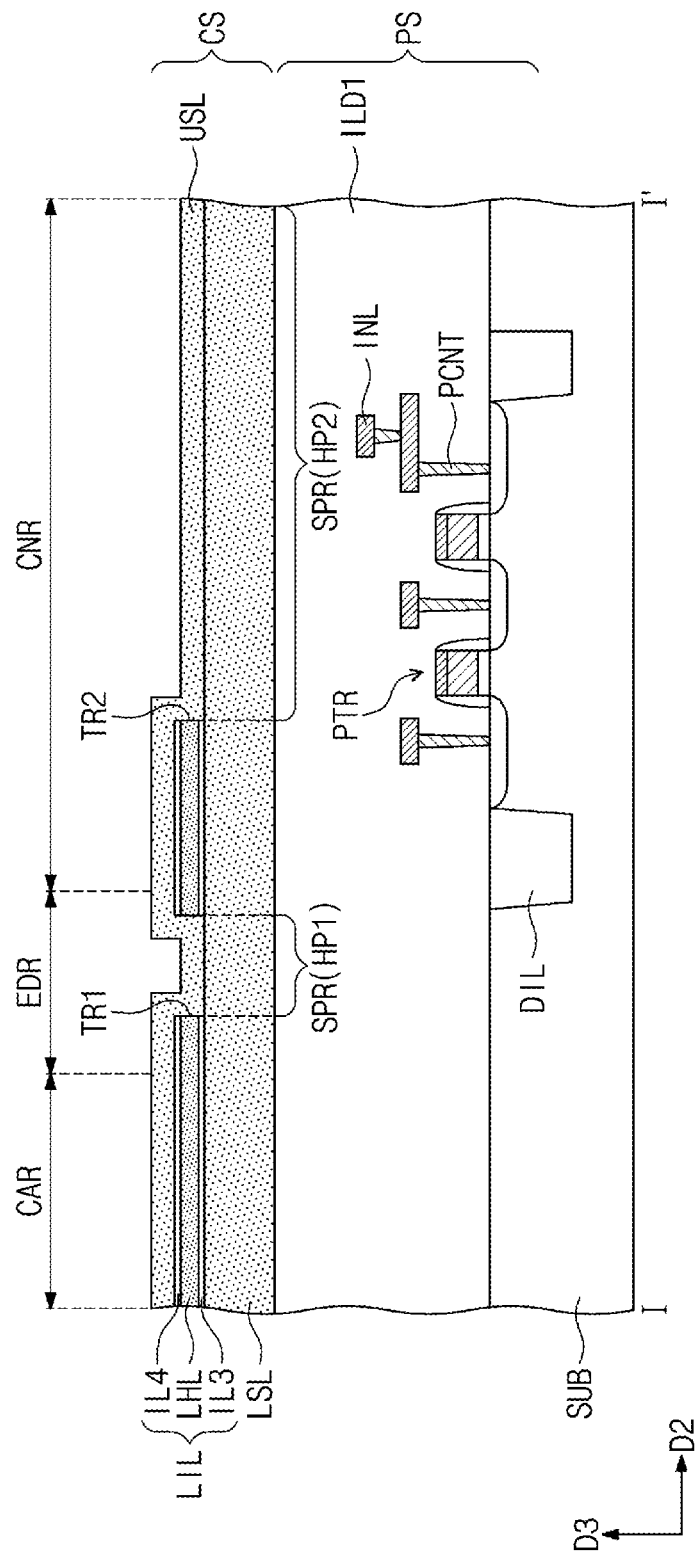
Figure 7B:
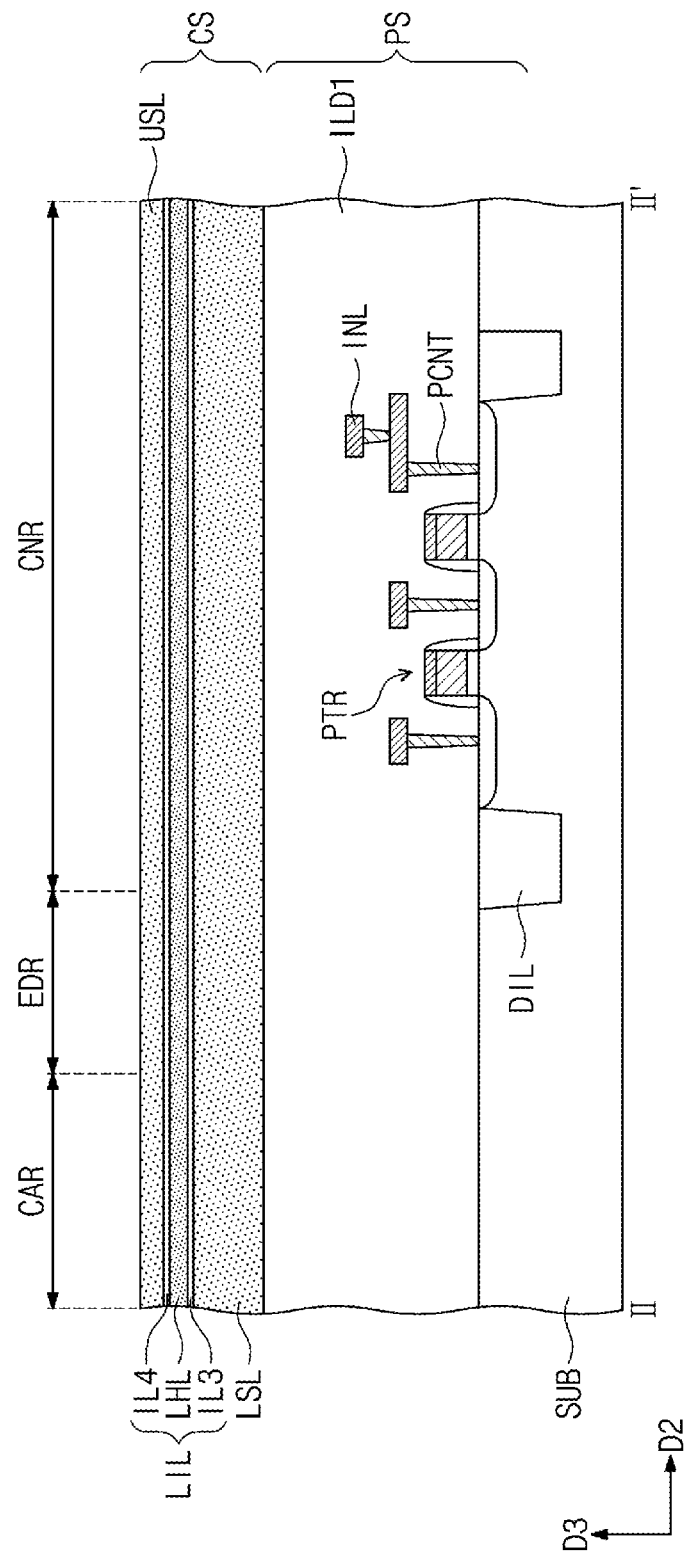
FIGS. 7B, 8B, 9B, 10B, and 11B are sectional views, which are taken along the line II-II' of FIG. 3 to illustrate some aspects of methods of fabricating three-dimensional semiconductor memory devices, according to some embodiments of the inventive concepts.
Figure 7C:
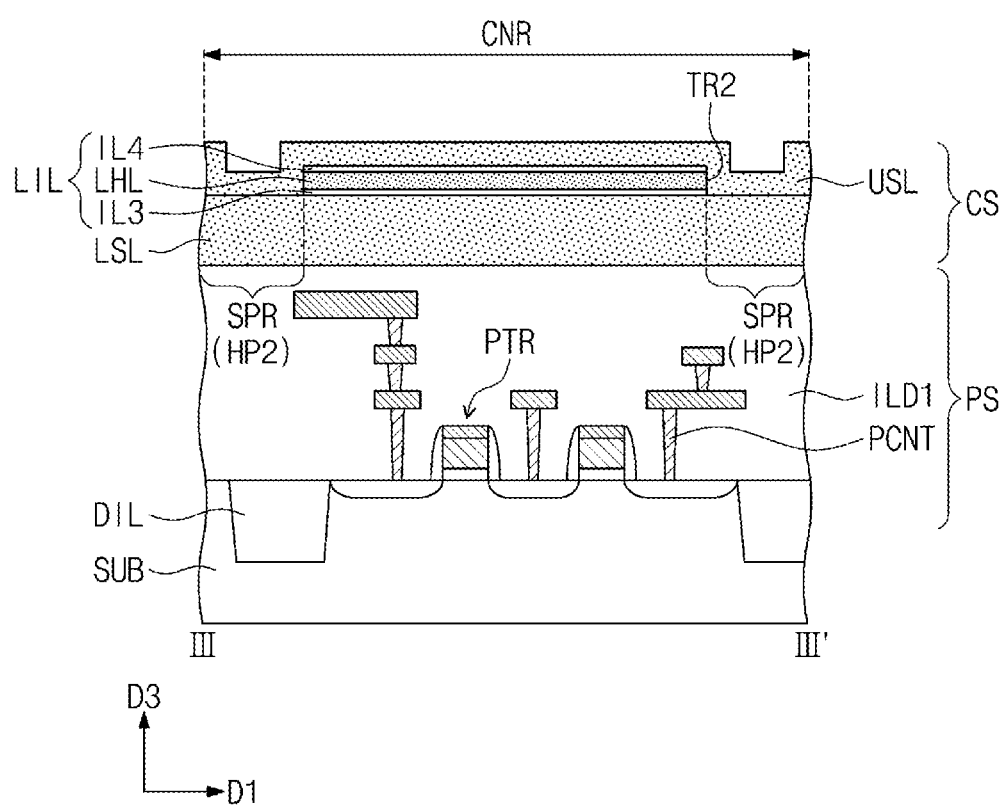
Figure 7D:
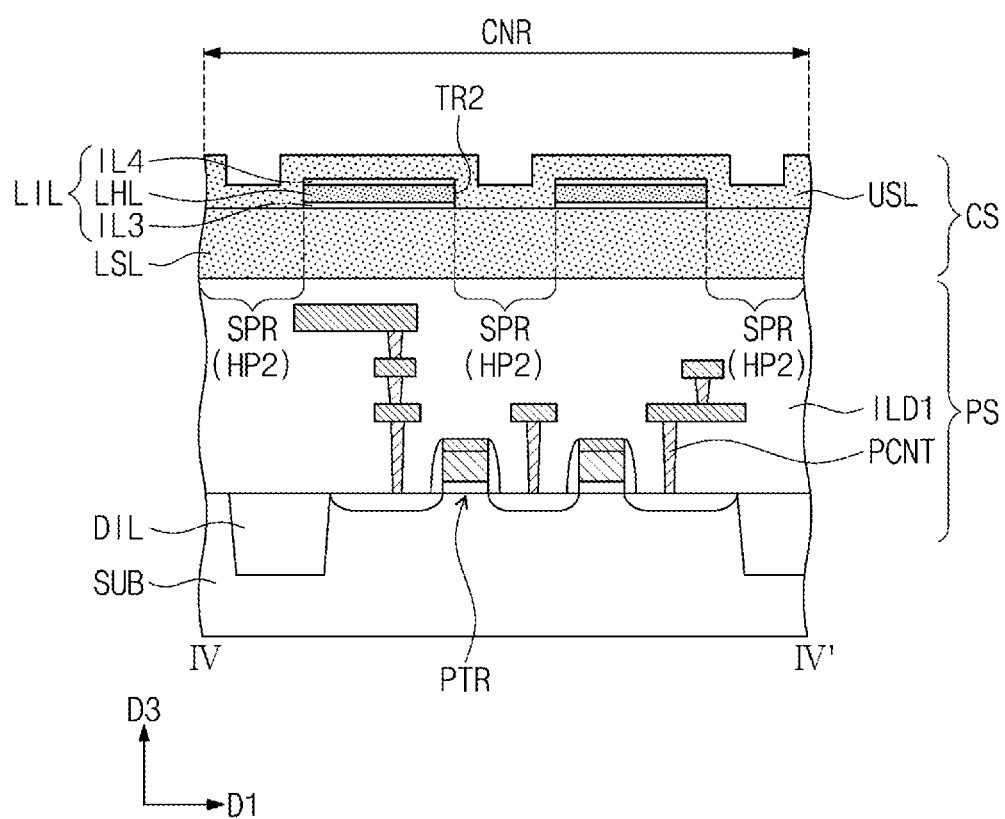
FIGS. 7D, 8D, 9D, 10D, and 11D are sectional views, which are taken along the line IV-IV' of FIG. 3 to illustrate some aspects of methods of fabricating three-dimensional semiconductor memory devices, according to some embodiments of the inventive concepts.
Figure 8A:
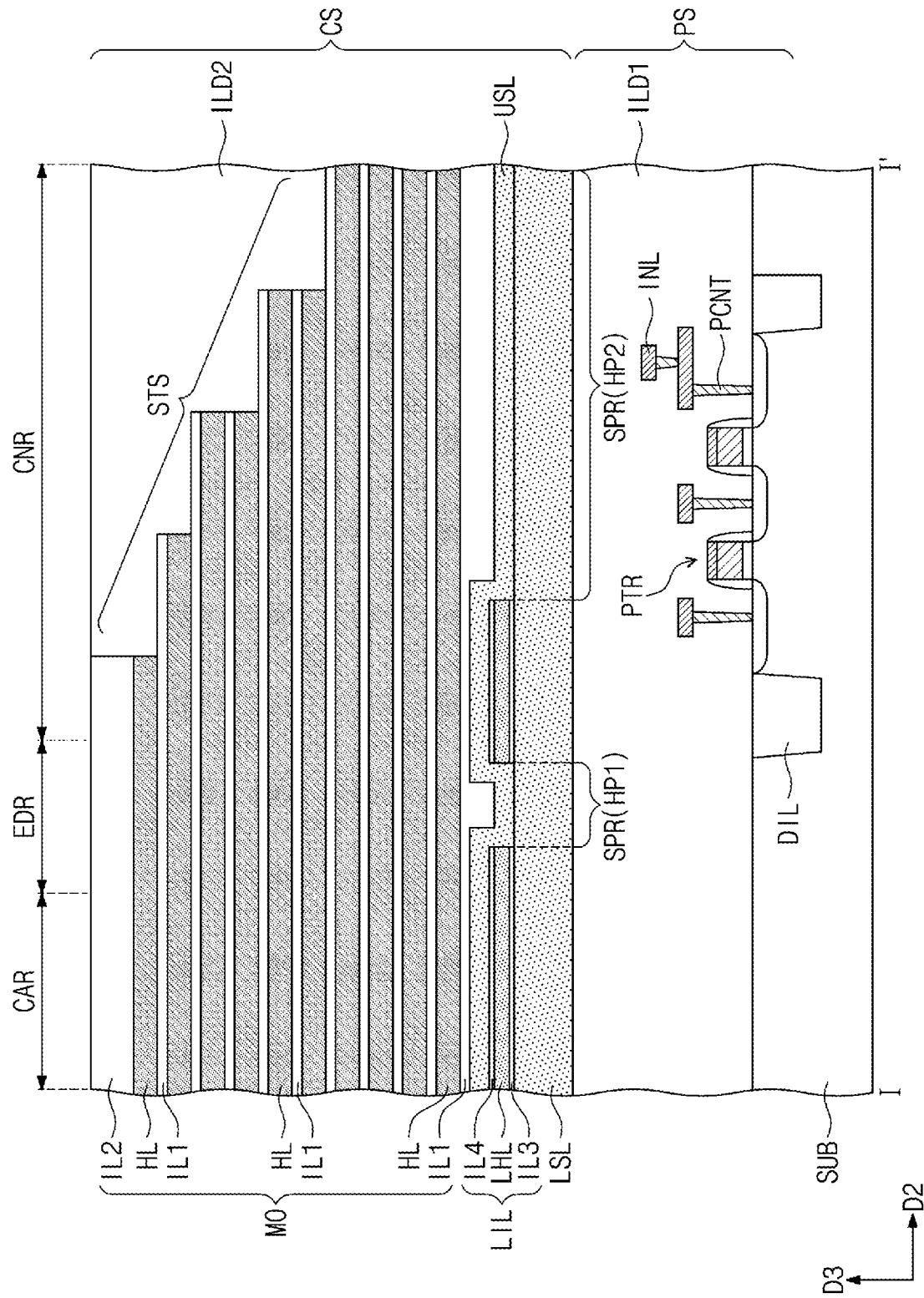
Figure 8B:
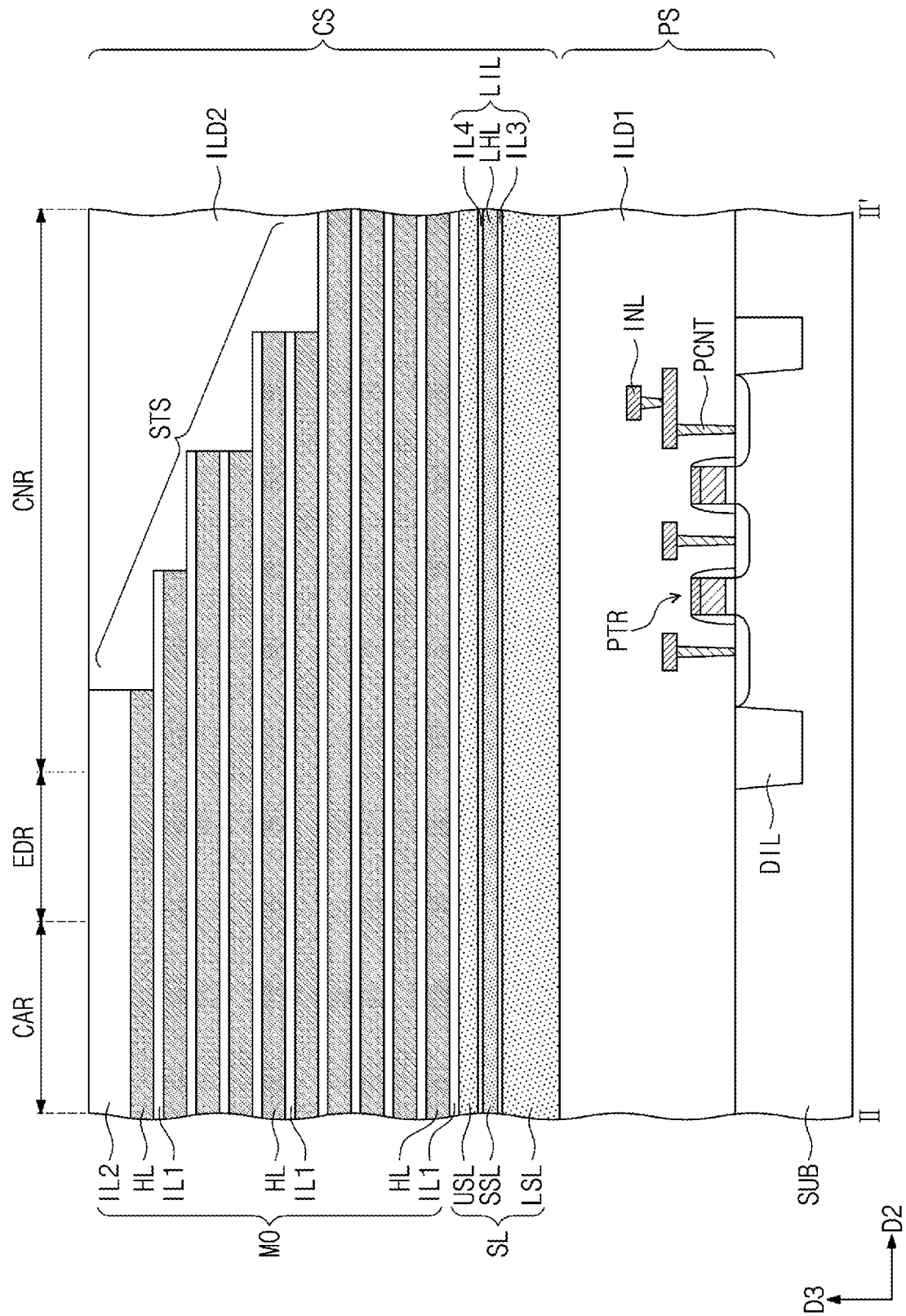
Figure 8C:
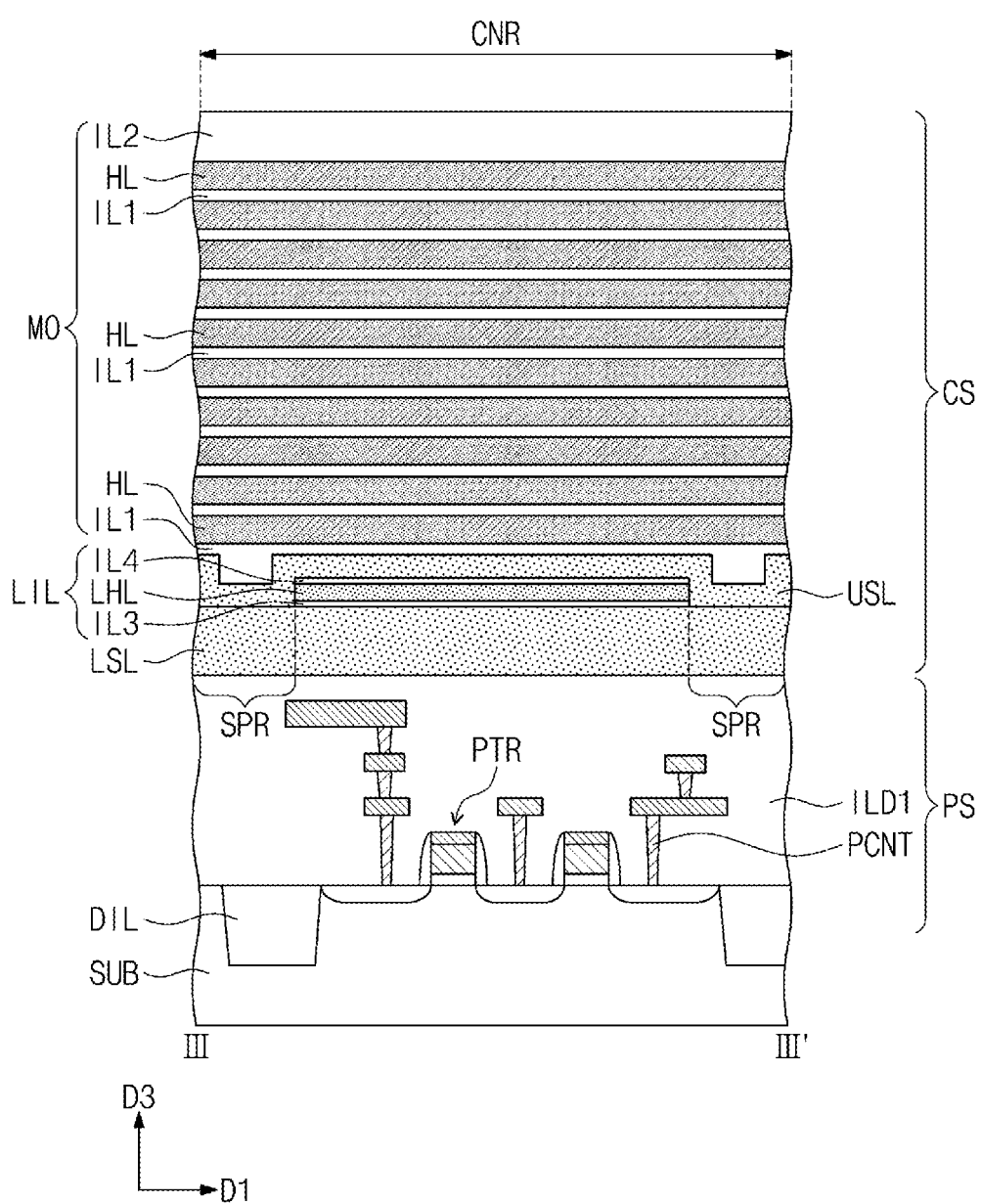
Figure 8D:
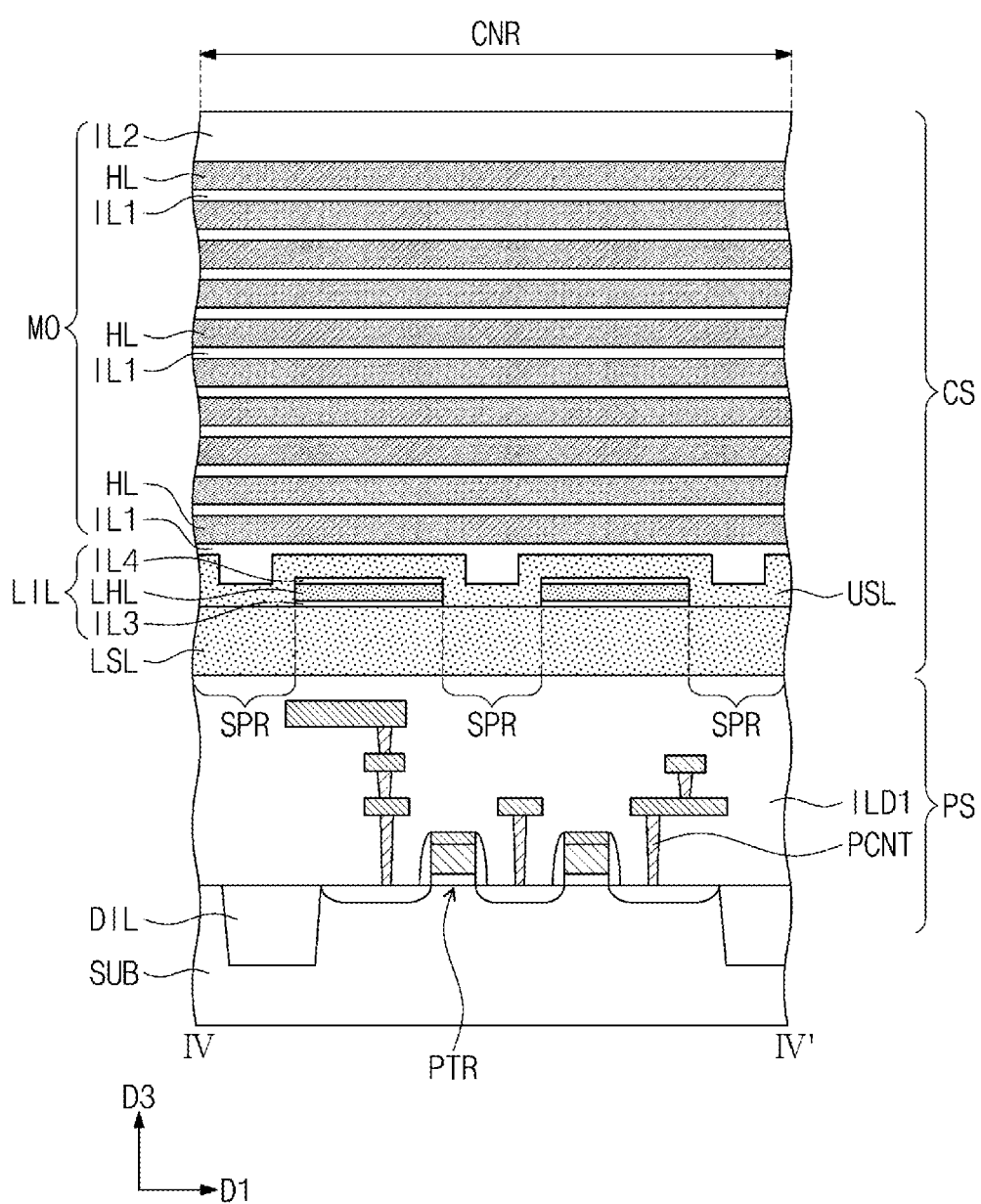
Figure 9A:
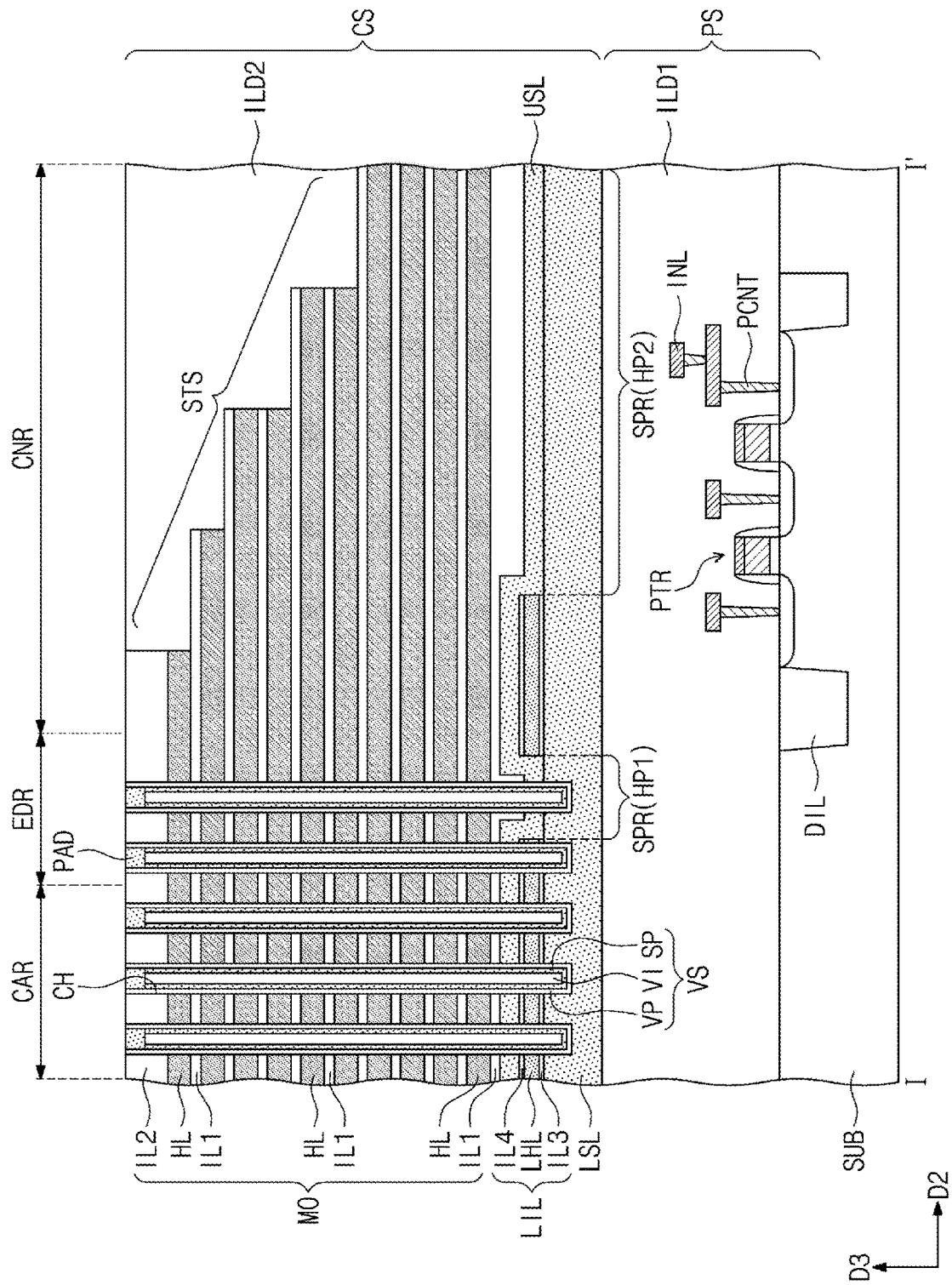
Figure 9B:
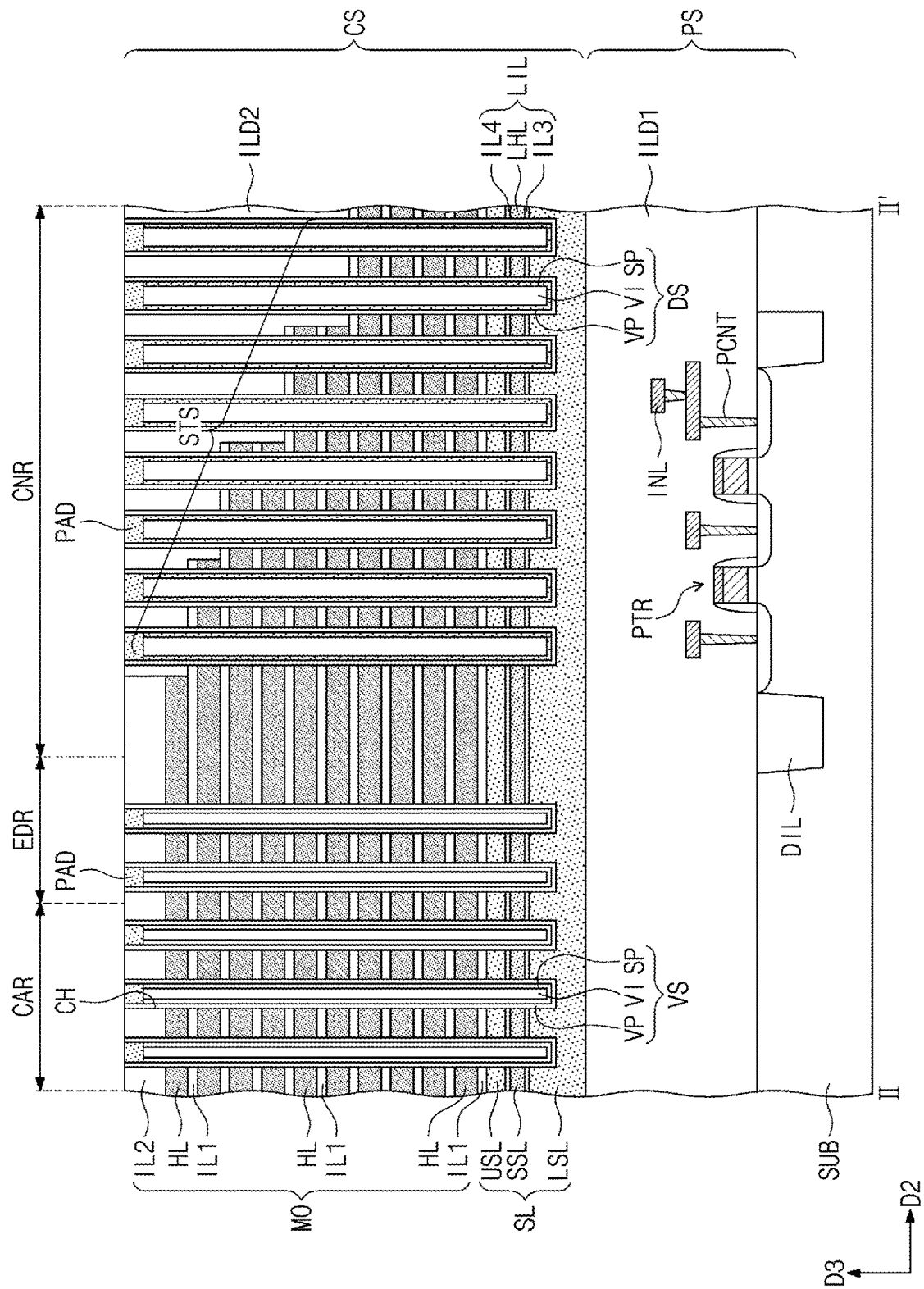
Figure 9C:
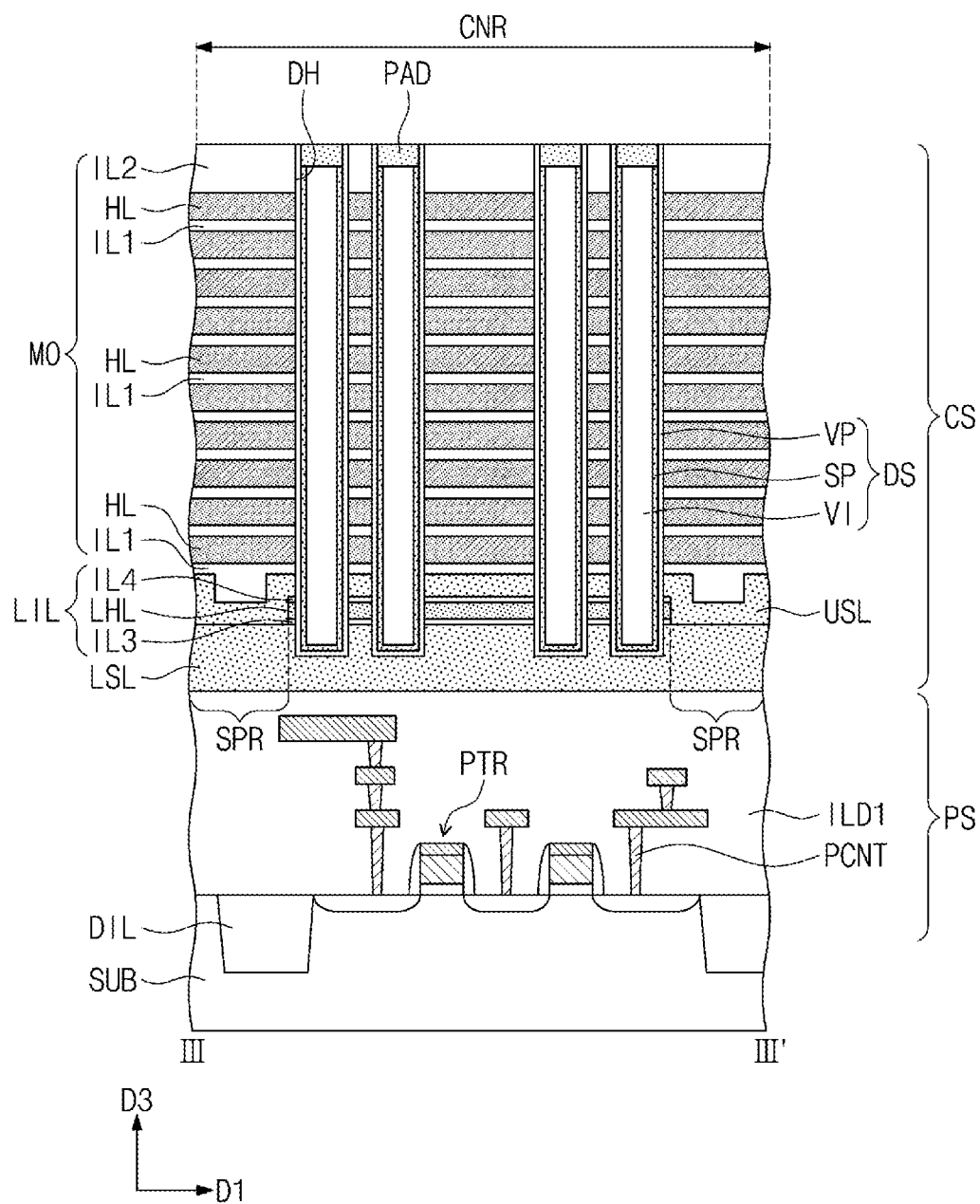
Figure 9D:
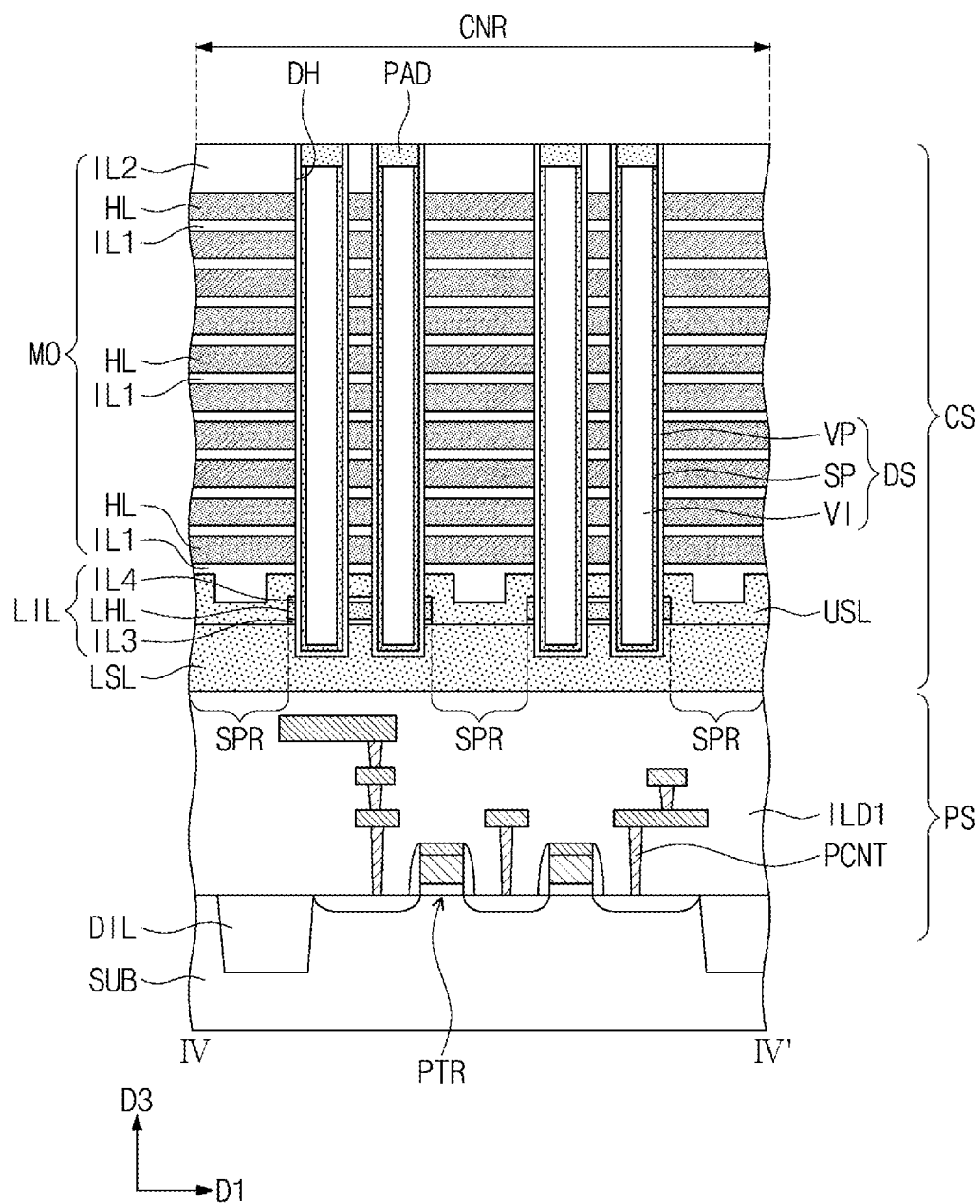

Referring to FIGS. 3, 6A, and 6B, the peripheral circuit structure PS may be formed on the first substrate SUB. The formation of the peripheral circuit structure PS may include forming the peripheral transistors PTR on the first substrate SUB and forming the lower interconnection lines INL on the peripheral transistors PTR. For example, the formation of the peripheral transistors PTR may include forming the device isolation layer DIL in the first substrate SUB to define active regions, forming a gate insulating layer and a gate electrode on the active regions, and injecting impurities into the active regions to form source/drain regions. The first interlayer insulating layer ILD1 may be formed to cover the peripheral transistors PTR and the lower interconnection lines INL.

The lower horizontal layer LSL may be formed on the first interlayer insulating layer ILD1. For example, the lower horizontal layer LSL may be formed of or include a semiconductor material, such as polysilicon. The lower insulating layer LIL may be formed on the lower horizontal layer LSL. The formation of the lower insulating layer LIL may include sequentially forming the third insulating layer IL3, the lower sacrificial layer LHL, and the fourth insulating layer IL4 on the lower horizontal layer LSL. The third and fourth insulating layers IL3 and IL4 may be formed of or include silicon oxide, and the lower sacrificial layer LHL may be formed of or include silicon nitride or silicon oxynitride.

Referring to FIGS. 3 and 7A to 7D, the lower insulating layer LIL may be patterned to form first and second trenches TR1 and TR2. The first and second trenches TR1 and TR2 may define the first and second horizontal extended portions HP1 and HP2, respectively, of the supporting portion SPR (e.g., shown in FIG. 3). In other words, the first trenches TR1 may extend in the first direction D1, and the second trenches TR2 may extend in the second direction D2.

The first and second trenches TR1 and TR2 may be formed on the cell edge region EDR and the connection region CNR. The first and second trenches TR1 and TR2 may not be formed on the cell array region CAR. The first and second trenches TR1 and TR2 may be formed to expose a top surface of the lower horizontal layer LSL.

The upper horizontal layer USL may be formed on the lower insulating layer LIL and may conform to the lower insulating layer LIL. For example, the upper horizontal layer USL may be formed of or include a semiconductor material, such as polysilicon. The upper horizontal layer USL may be formed to partially fill the first and second trenches TR1 and TR2. A bottom surface of the upper horizontal layer USL in the first and second trenches TR1 and TR2 may be lower than a bottom surface of the upper horizontal layer USL on the lower insulating layer LIL. The upper horizontal layer USL in the first and second trenches TR1 and TR2 may be formed to be in direct contact with the top surface of the lower horizontal layer LSL.

A portion of the upper horizontal layer USL that fills the first and second trenches TR1 and TR2 may be defined as the supporting portion SPR. The supporting portion SPR may include the first horizontal extended portion HP1 that fills the first trench TR1 and the second horizontal extended portion HP2 that fills the second trench TR2. Since the first and second trenches TR1 and TR2 are not formed on the cell array region CAR, the supporting portion SPR may not be formed on the cell array region CAR.

Referring to FIGS. 3 and 8A to 8D, a mold structure MO may be formed on the upper horizontal layer USL. For example, the mold structure MO may be formed by alternately stacking the first insulating layers IL1 and sacrificial layers HL on the upper horizontal layer USL. The second insulating layer IL2 may be formed as the topmost layer of the mold structure MO.

The first insulating layers IL1, the sacrificial layers HL, and the second insulating layer IL2 may be deposited using at least one of thermal chemical vapor deposition, plasma-enhanced chemical vapor deposition, physical chemical vapor deposition, or atomic layer deposition (ALD) processes. The first insulating layers IL1 and the second insulating layer IL2 may be formed of or include silicon oxide, and the sacrificial layers HL may be formed of or include silicon nitride or silicon oxynitride.

A lowermost of the first insulating layers IL1 (that is, the first insulating layer IL1 closest to the substrate SUB) may have a greater thickness in the first and second trenches TR1 and TR2 than in regions outside of the first and second trenches TR1 and TR2.

The mold structure MO on the connection region CNR may be patterned to have the staircase structure STS. For example, the staircase structure STS may be formed on the connection region CNR by performing a cyclic process on the mold structure MO. The formation of the staircase structure STS may include forming a mask pattern (not shown) on the mold structure MO and performing a cyclic patterning process using the mask pattern several times. Each cyclic patterning process may include etching a portion of the mold structure MO using the mask pattern as an etch mask and performing a trimming process to reduce a size of the mask pattern.

The second interlayer insulating layer ILD2 may be formed on the mold structure MO. The formation of the second interlayer insulating layer ILD2 may include forming an insulating layer to cover the mold structure MO and then performing a planarization process on the insulating layer to expose the second insulating layer IL2.

Referring to FIGS. 3 and 9A to 9D, channel holes CH penetrating the mold structure MO may be formed on the cell array region CAR and the cell edge region EDR. Dummy holes DH penetrating the mold structure MO may be formed on the connection region CNR. The dummy holes DH may be formed to penetrate the staircase structure STS of the mold structure MO. Each of the channel and dummy holes CH and DH may be formed to expose the lower horizontal layer LSL.

In greater detail, the formation of the channel holes CH and the dummy holes DH may include forming a mask pattern (not shown), which has openings defining positions and shapes of holes, on the mold structure MO and anisotropically etching the mold structure MO using the mask pattern as an etch mask. The anisotropic etching process may include a plasma etching process, a reactive ion etching (ME) process, an inductively-coupled plasma reactive ion etching (ICP-RIE) process, or an ion beam etching (IBE) process.

When viewed in a plan view, the channel holes CH may be arranged in a specific direction or in a zigzag shape. The channel holes CH may be arranged in the same shape as that of the vertical channel structures VS previously described with reference to FIG. 3. The largest diameter of each of the channel holes CH may be smaller than the largest diameter of each of the dummy holes DH.

The vertical channel structures VS may be formed in the channel holes CH, respectively. The formation of the vertical channel structures VS may include sequentially forming the vertical insulating pattern VP, the vertical semiconductor pattern SP, and the insulating gap-fill pattern VI on inner surfaces of the channel holes CH. The vertical insulating pattern VP and the vertical semiconductor pattern SP may be formed to conform to surfaces of the channel holes CH and the vertical insulating pattern VP, respectively.

The dummy structures DS may be formed in the dummy holes DH, respectively. The dummy structures DS may be formed concurrently with the vertical channel structures VS. The conductive pad PAD may be formed on each of the vertical channel structures VS and the dummy structures DS.

Referring to FIGS. 3 and 10A to 10D, the third interlayer insulating layer ILD3 may be formed on the mold structure MO and the second interlayer insulating layer ILD2. The mold structure MO may be patterned to form cutting holes CTH penetrating the mold structure MO. The cutting holes CTH may be extended in the second direction D2 and parallel to each other to cut the mold structure MO in the second direction D2 (e.g., see SPS of FIG. 3). Each of the cutting holes CTH may define a region, in which a separation structure SPS to be described below will be formed.

A spacer SPC may be formed on an inner side surface of the cutting hole CTH. The spacer SPC may prevent the mold structure MO from being exposed to the cutting hole CTH. The spacer SPC may not be formed on a bottom of the cutting hole CTH.

Figure 10A:
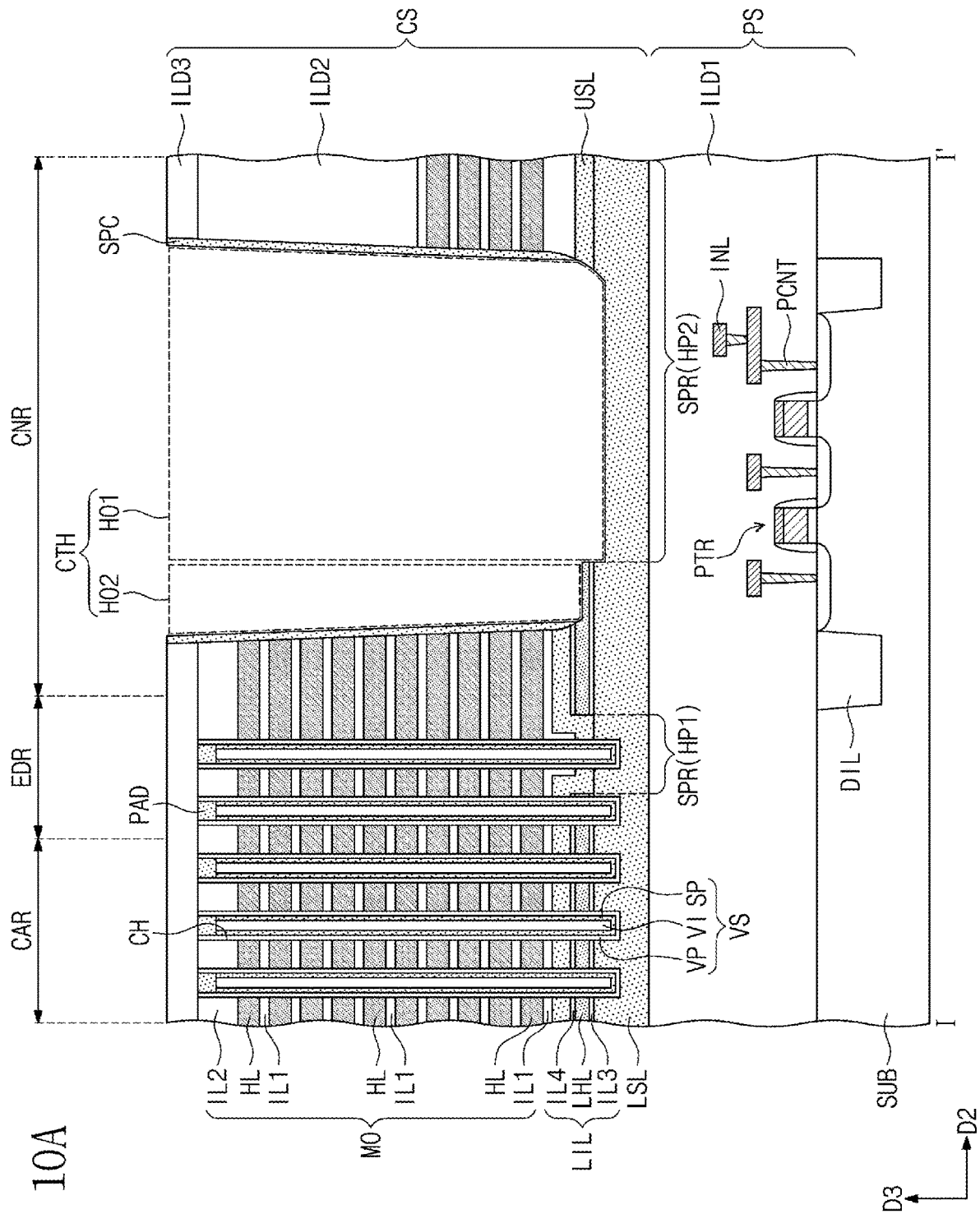
Figure 10B:
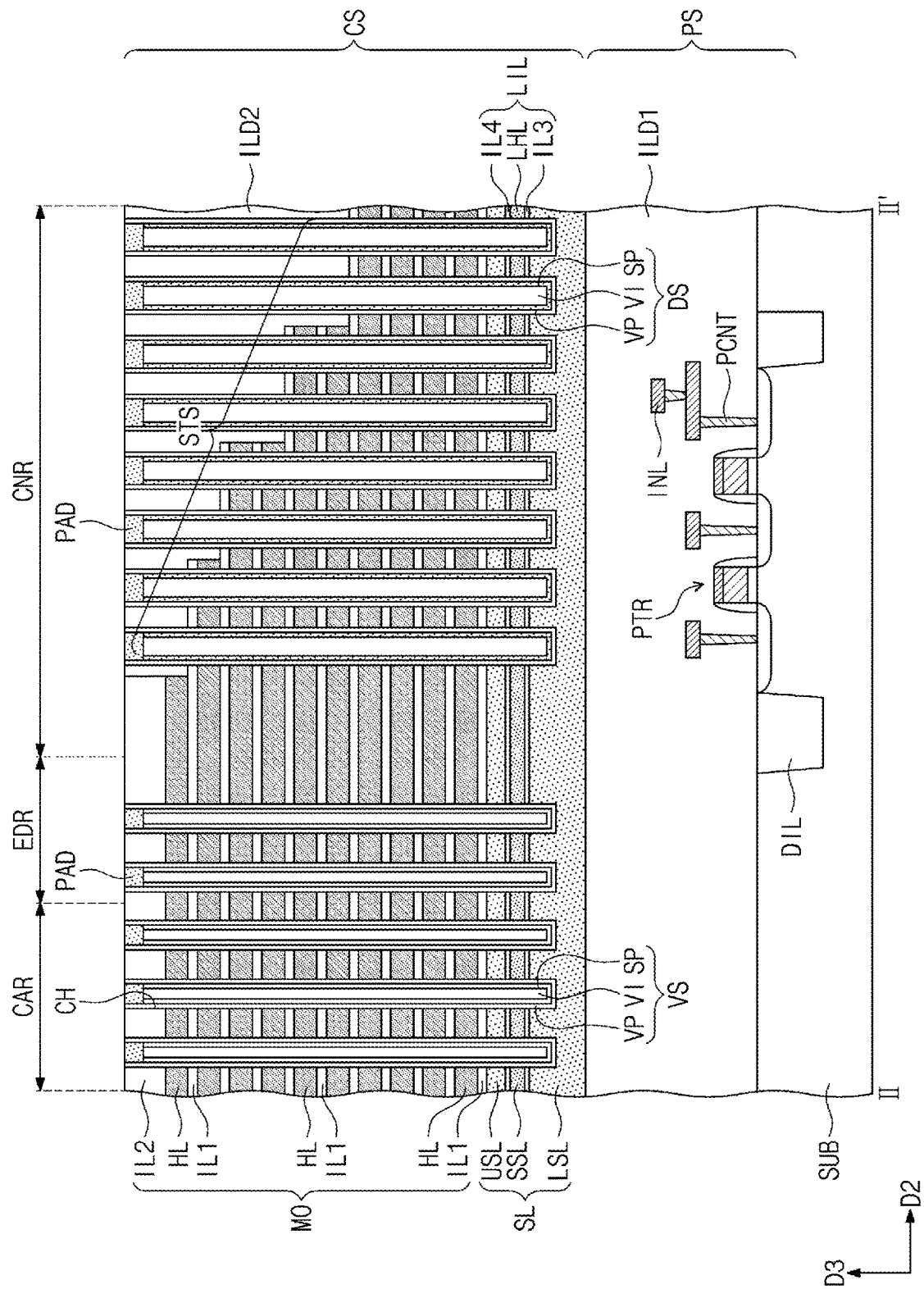
Figure 10C:
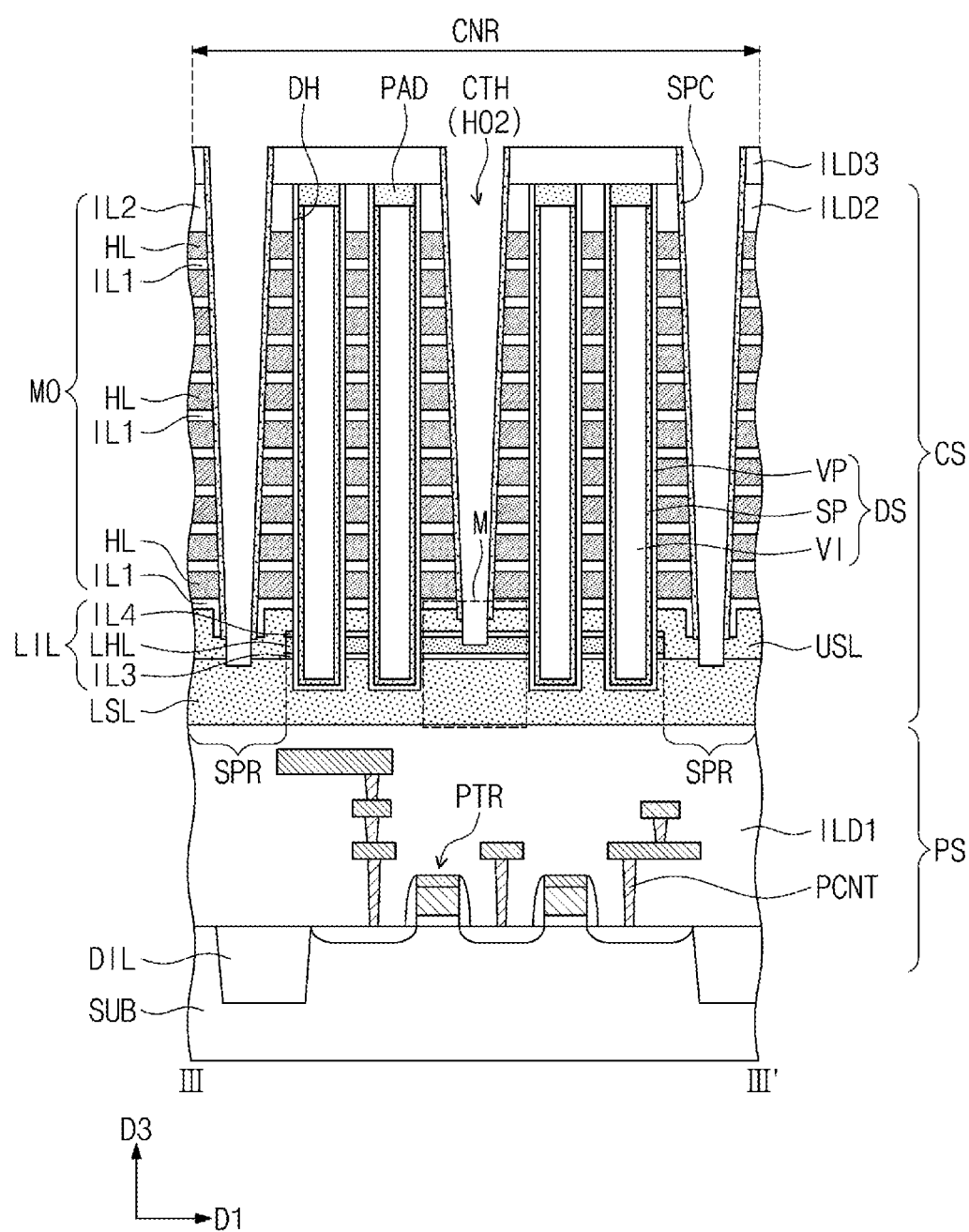
Figure 10D:
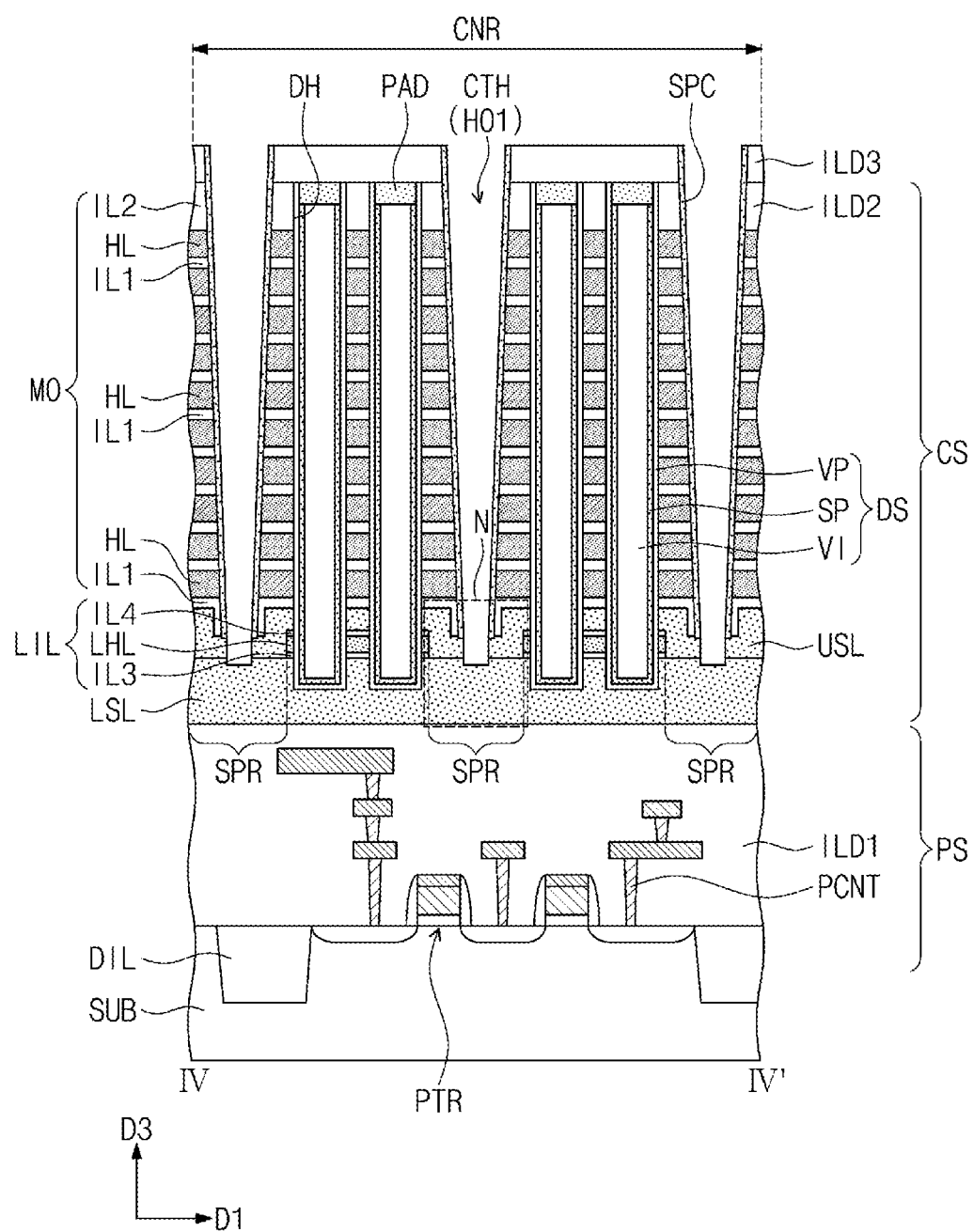

The cutting hole CTH on the connection region CNR may include a first hole HO1, which is formed on the supporting portion SPR, and a second hole HO2, which is formed on the lower insulating layer LIL. Referring to FIG. 10D, a bottom of the first hole HO1 may be positioned between bottom and top surfaces of the lower horizontal layer LSL. The first hole HO1 may be formed to expose the lower horizontal layer LSL. Referring to FIG. 10C, a bottom of the second hole HO2 may be positioned between bottom and top surfaces of the lower sacrificial layer LHL. The second hole HO2 may be formed to expose the lower sacrificial layer LHL. In other words, the cutting hole CTH, which is formed on the lower insulating layer LIL, may expose the lower sacrificial layer LHL. The cutting hole CTH, which is formed on the supporting portion SPR, may not expose the lower sacrificial layer LHL.

Referring to FIGS. 3 and 11A to 11D, the lower sacrificial layer LHL exposed through the cutting hole CTH may be replaced with the source horizontal layer SSL. In detail, the lower sacrificial layer LHL exposed through the cutting hole CTH may be selectively removed. As a result of the removal of the lower sacrificial layer LHL, a lower portion of the vertical insulating pattern VP of each of the vertical channel structures VS may be exposed.

The exposed lower portion of the vertical insulating pattern VP may be selectively removed. Accordingly, a lower portion of the vertical semiconductor pattern SP may be exposed. The third insulating layer IL3 and the fourth insulating layer IL4 may also be removed during the removal of the lower portion of the vertical insulating pattern VP.

The source horizontal layer SSL may be formed in a space that results from removing the third insulating layer IL3, the lower sacrificial layer LHL, and the fourth insulating layer IL4. The source horizontal layer SSL may be in direct contact with the exposed lower portion of the vertical semiconductor pattern SP. The source horizontal layer SSL may be in direct contact with the lower horizontal layer LSL thereunder. The source horizontal layer SSL may be in direct contact with the upper horizontal layer USL thereon. The lower horizontal layer LSL, the source horizontal layer SSL, and the upper horizontal layer USL may constitute the second substrate SL.

Figure 11A:
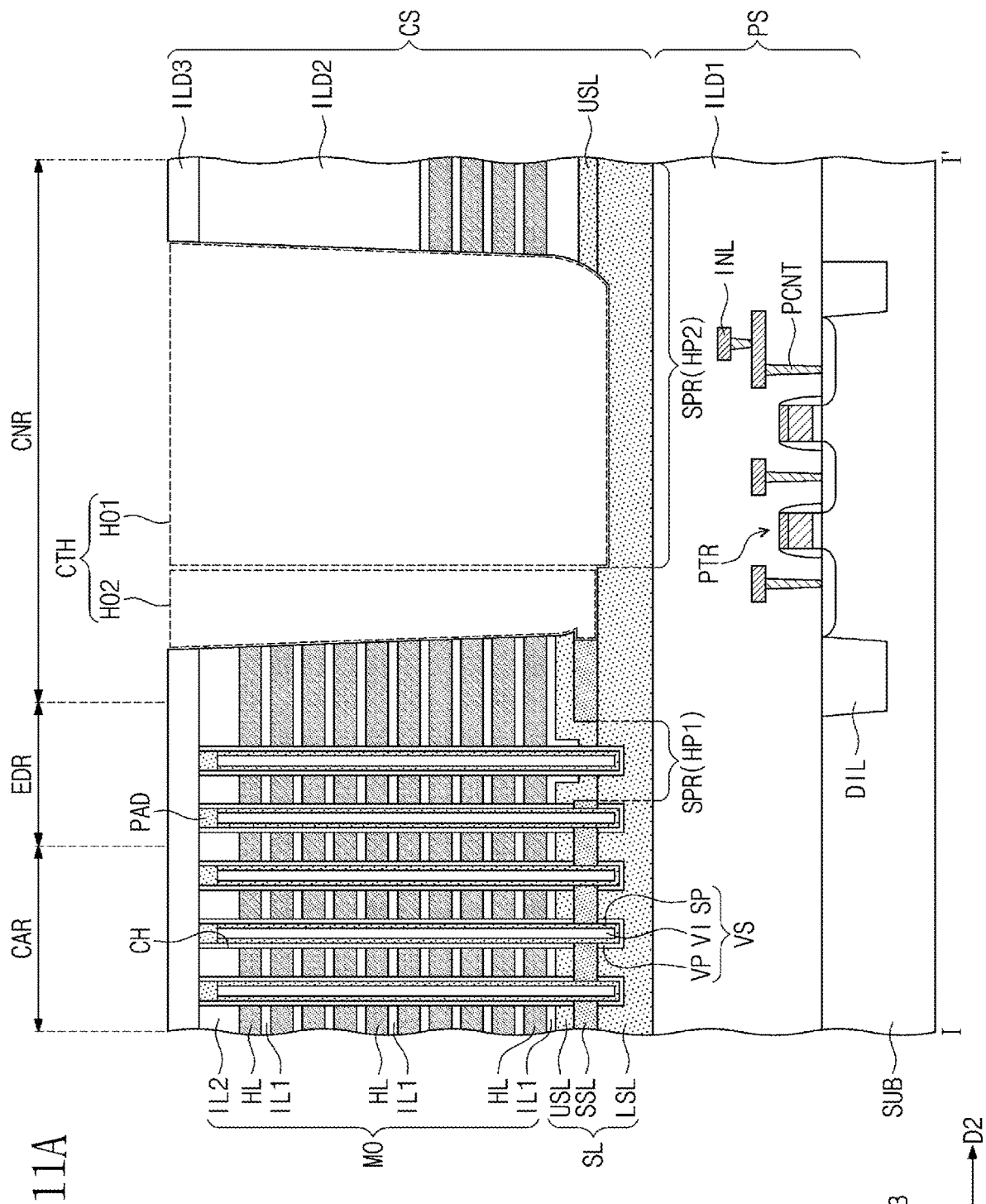
Figure 11B:
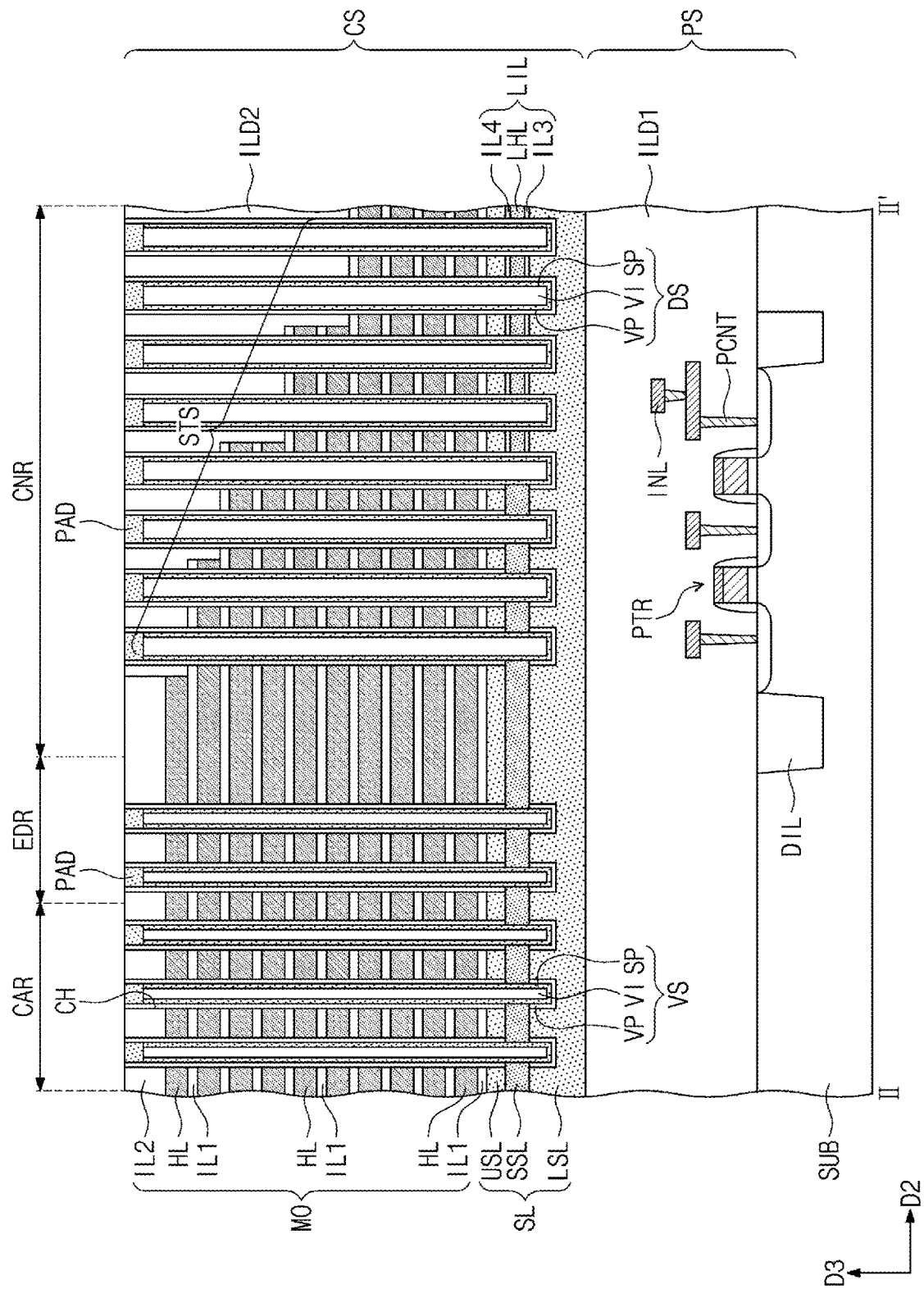
Figure 11C:
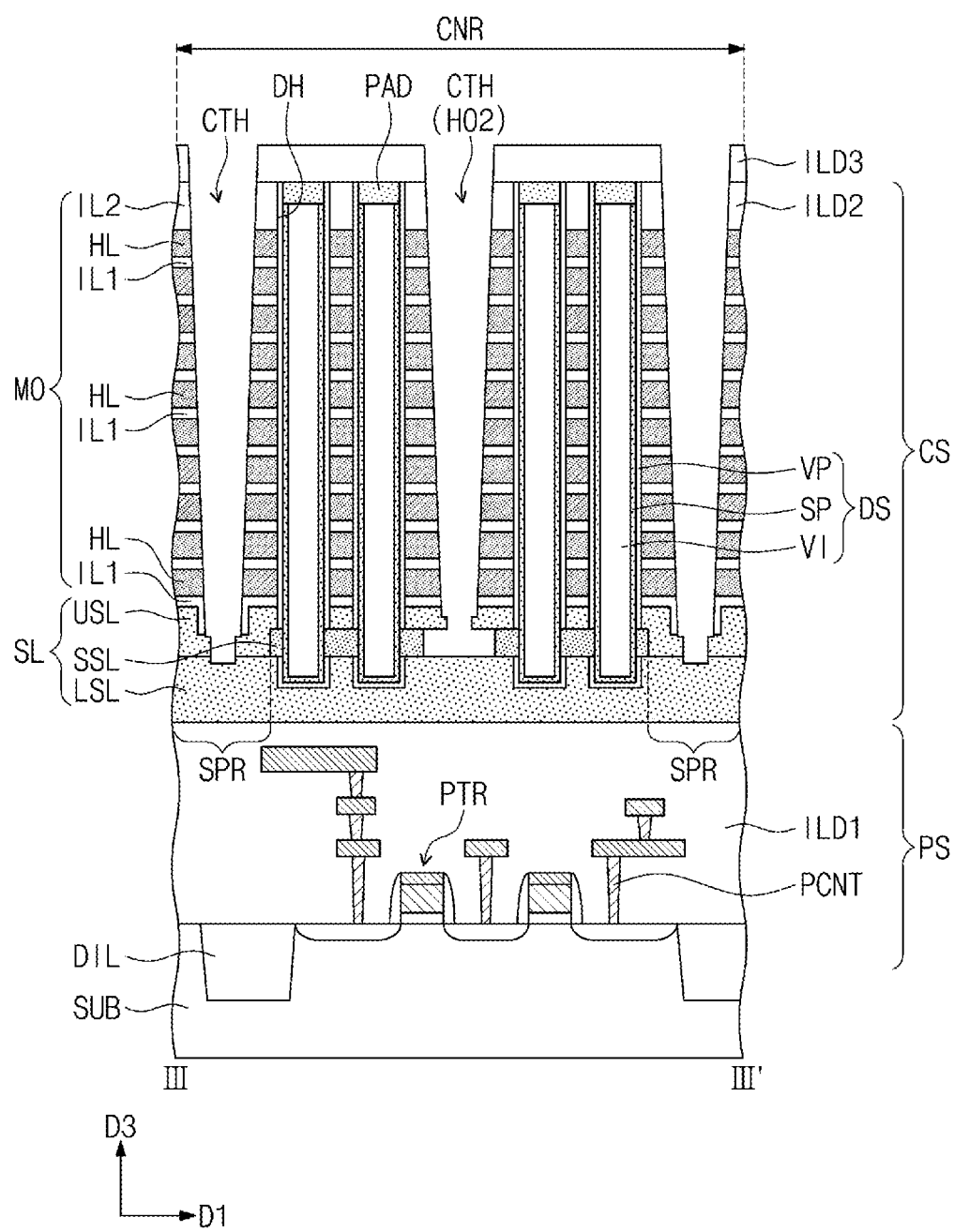
Figure 11D:
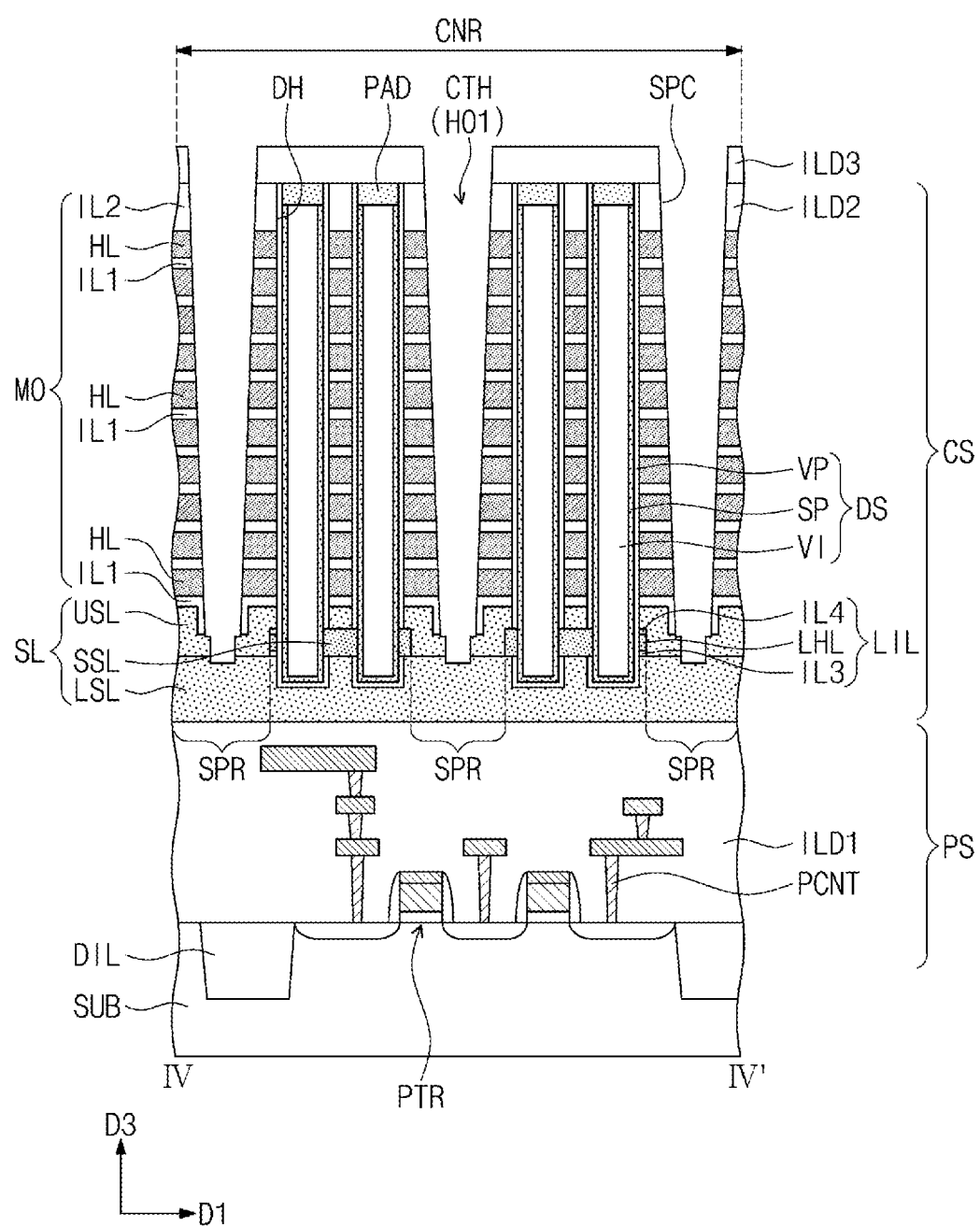

The formation of the source horizontal layer SSL may include repeating deposition and etching steps. In the case where a space between the lower and upper horizontal layers LSL and USL is fully filled with the source horizontal layer SSL, a trimming process may be performed through the cutting hole CTH. Thus, a lower region of the second hole HO2 of the cutting hole CTH may be horizontally expanded, as shown in FIG. 11C. The spacer SPC may be removed through the trimming process. Since the spacer SPC is removed, the sacrificial layers HL may be exposed through the cutting holes CTH.

Meanwhile, since the cutting hole CTH (e.g., the first hole HO1) formed on the supporting portion SPR does not expose the lower sacrificial layer LHL, the replacement of the source horizontal layer SSL through the first hole HO1 may not be achieved. Thus, in the connection region CNR, the lower insulating layer LIL may be partially left in a region adjacent to the first hole HO1 (e.g., see FIG. 11B). Referring to FIG. 3, the border BD, at which the source horizontal layer SSL and the lower insulating layer LIL meet each other, may be formed on the connection region CNR.

Referring back to FIGS. 3 and 4A to 4E, the electrode structure ST may be formed by replacing the exposed sacrificial layers HL with the electrodes EL, respectively. The sacrificial layers HL exposed through the cutting holes CTH may be selectively removed. The electrodes EL may be formed in empty regions, respectively, which are formed through the removal of the sacrificial layers HL. Thereafter, the cutting holes CTH may be filled with an insulating material, and as a result, the separation structures SPS may be formed in the cutting holes CTH, respectively.

The bit line contact plugs BPLG, which penetrate the third interlayer insulating layer ILD3 and are respectively coupled to the conductive pads PAD, may be formed on the cell array region CAR. The cell contact plugs PLG, which penetrate the second and third interlayer insulating layers ILD2 and ILD3 and are respectively coupled to the electrodes EL of the staircase structure STS, may be formed on the connection region CNR. The bit lines BL and the upper interconnection lines UIL, which are electrically and respectively connected to the bit line contact plugs BPLG and the cell contact plugs PLG, may be formed on the third interlayer insulating layer ILD3.

Figure 12A:
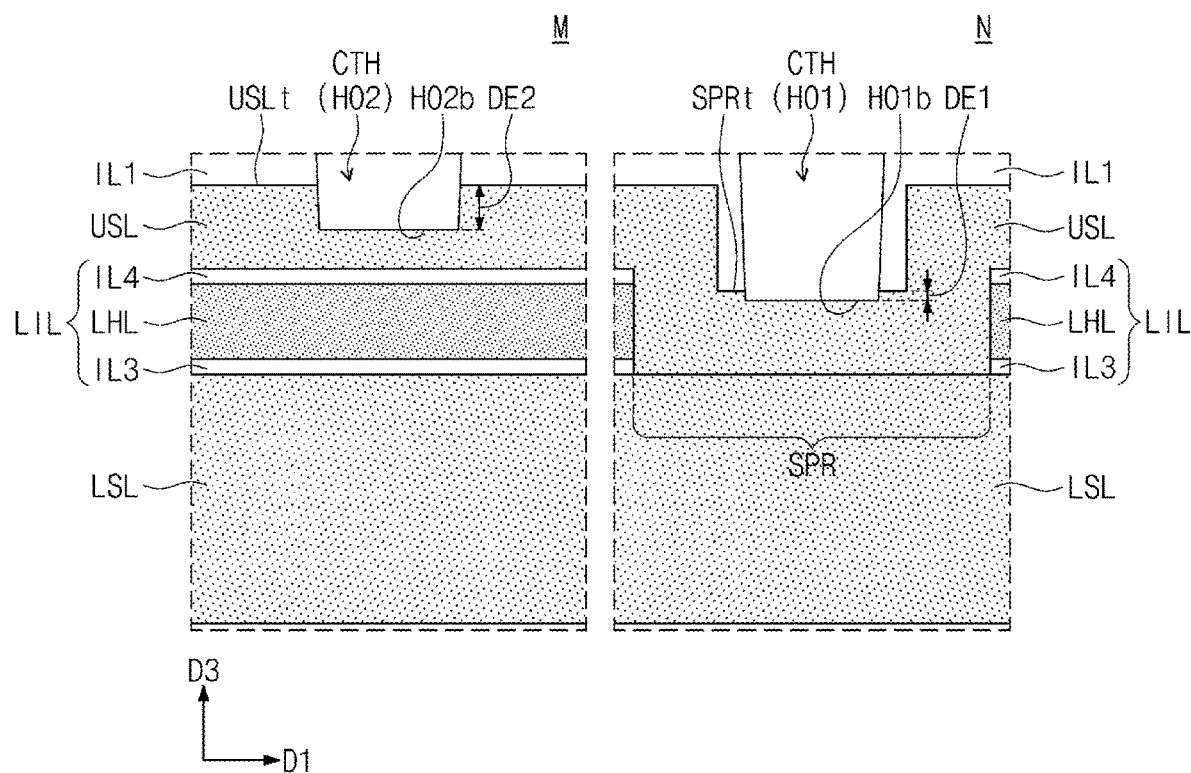
FIGS. 12A, 12B, and 12C are enlarged sectional views illustrating a replacement process of a source horizontal layer (e.g., at a portion M of FIG. 10C and a portion N of FIG. 10D) according to some embodiments of the inventive concepts.
Figure 12B:
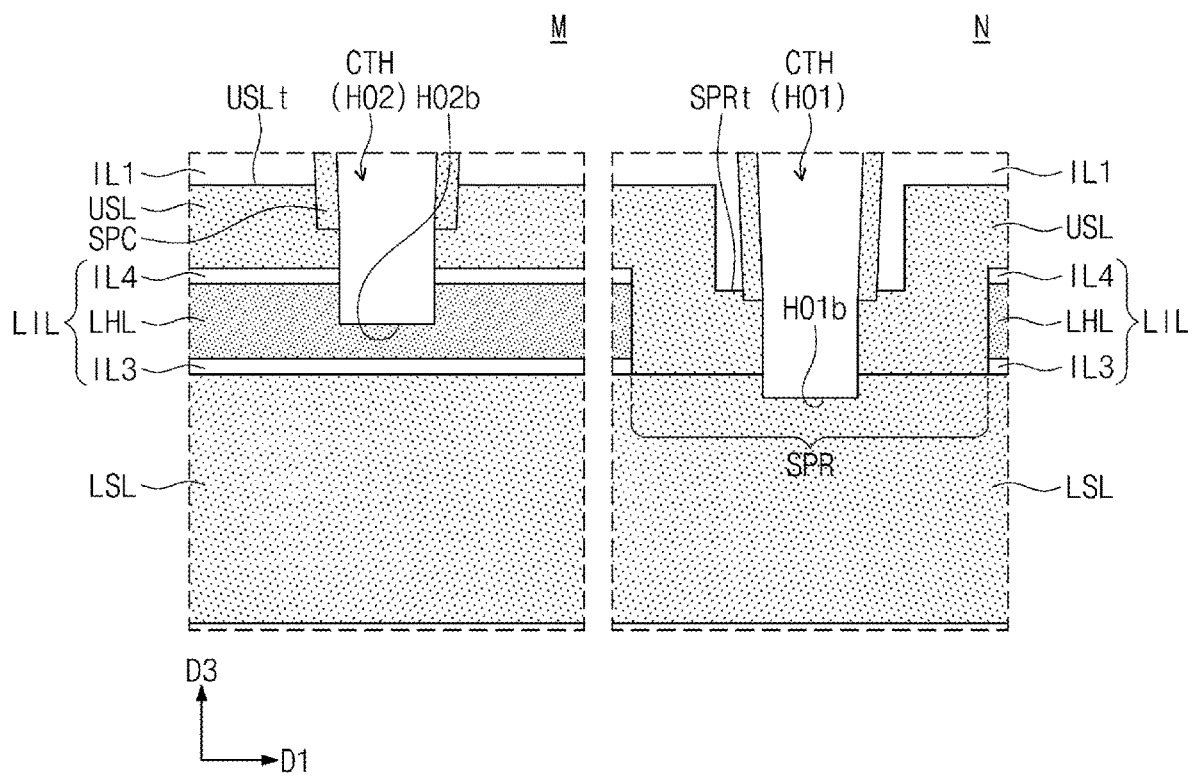
Figure 12C:
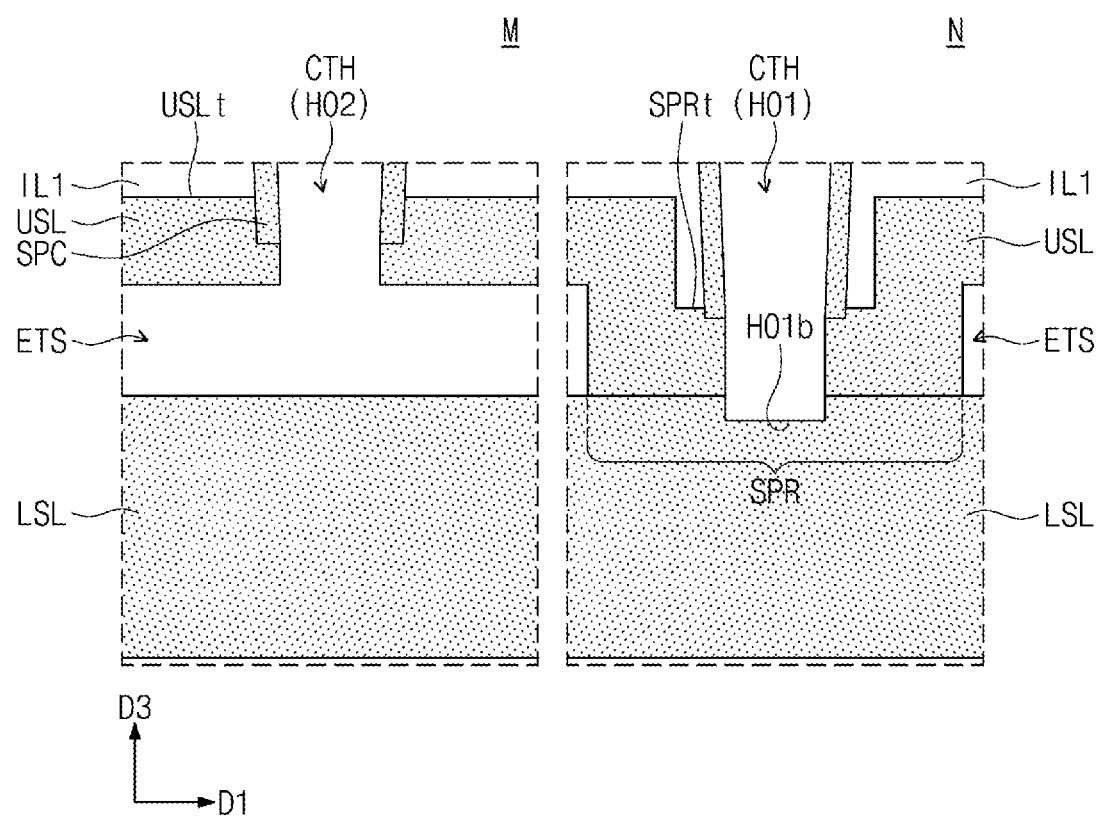

FIGS. 12A, 12B, and 12C are enlarged sectional views illustrating a replacement process of a source horizontal layer (e.g., at a portion M of FIG. 10C and a portion N of FIG. 10D) according to some embodiments of the inventive concepts.

Referring to FIGS. 10C, 10D, and 12A, the cutting hole CTH may be formed by patterning the mold structure MO on the connection region CNR. The cutting hole CTH may include the first hole HO1, which is formed on the supporting portion SPR, and the second hole HO2, which is formed on the lower insulating layer LIL.

The top surface SPRt of the supporting portion SPR, which is located below the first hole HO1, may be lower than the top surface USLt of the upper horizontal layer USL. In other words, the supporting portion SPR may be located at a position that is deeper than the upper horizontal layer USL. A bottom HO1b of the first hole HO1 may be recessed from the top surface SPRt of the supporting portion SPR by a first depth DE1, and a bottom HO2b of the second hole HO2 may be recessed from the top surface USLt of the upper horizontal layer USL by a second depth DE2. The first depth DE1 may be smaller than the second depth DE2.

Referring to FIGS. 10C, 10D, and 12B, the spacer SPC may be formed on an inner side surface of each of the first and second holes HO1 and HO2. The formation of the spacer SPC may include forming a spacer layer to cover and conform to at least one surface of the cutting hole CTH and anisotropically etching the spacer layer to expose a bottom of the cutting hole CTH.

After the formation of the spacer SPC, an anisotropic etching process may be performed on the cutting hole CTH to further recess the bottom HO1b of the first hole HO1 and the bottom HO2b of the second hole HO2. The bottom HO1b of the first hole HO1 may be lowered to a level that is lower than the top surface of the lower horizontal layer LSL. The bottom HO2b of the second hole HO2 may be positioned between top and bottom surfaces of the lower sacrificial layer LHL.

Referring to FIGS. 10C, 10D, and 12C, the lower insulating layer LIL, which is exposed through the second hole HO2, may be selectively removed. The removal of the lower insulating layer LIL may be performed using a wet etching process. As a result of the removal of the lower insulating layer LIL, an empty space ETS may be formed between the upper and lower horizontal layers USL and LSL. Thereafter, the empty space ETS may be filled with the source horizontal layer SSL, as previously described with reference to FIGS. 3 and 11A to FIG. 11D.

Since an empty space ETS may be formed between the upper and lower horizontal layers USL and LSL, a physical structure thereof may be weakened. Meanwhile, the supporting portion SPR may be left as it is, even when the wet etching process is finished, and thus, the supporting portion SPR may fix the upper and lower horizontal layers USL and LSL to each other. Accordingly, it may be possible to prevent a leaning or collapsing issue of the mold structure MO, which may be caused by the empty space ETS.

The larger the area of the supporting portion SPR, the stronger the mechanical supporting strength between the upper and lower horizontal layers USL and LSL. However, in the case where the supporting portion SPR has an excessively large area, a process failure may occur, as will be described with reference to FIGS. 13A to 13C.

Figure 13A:
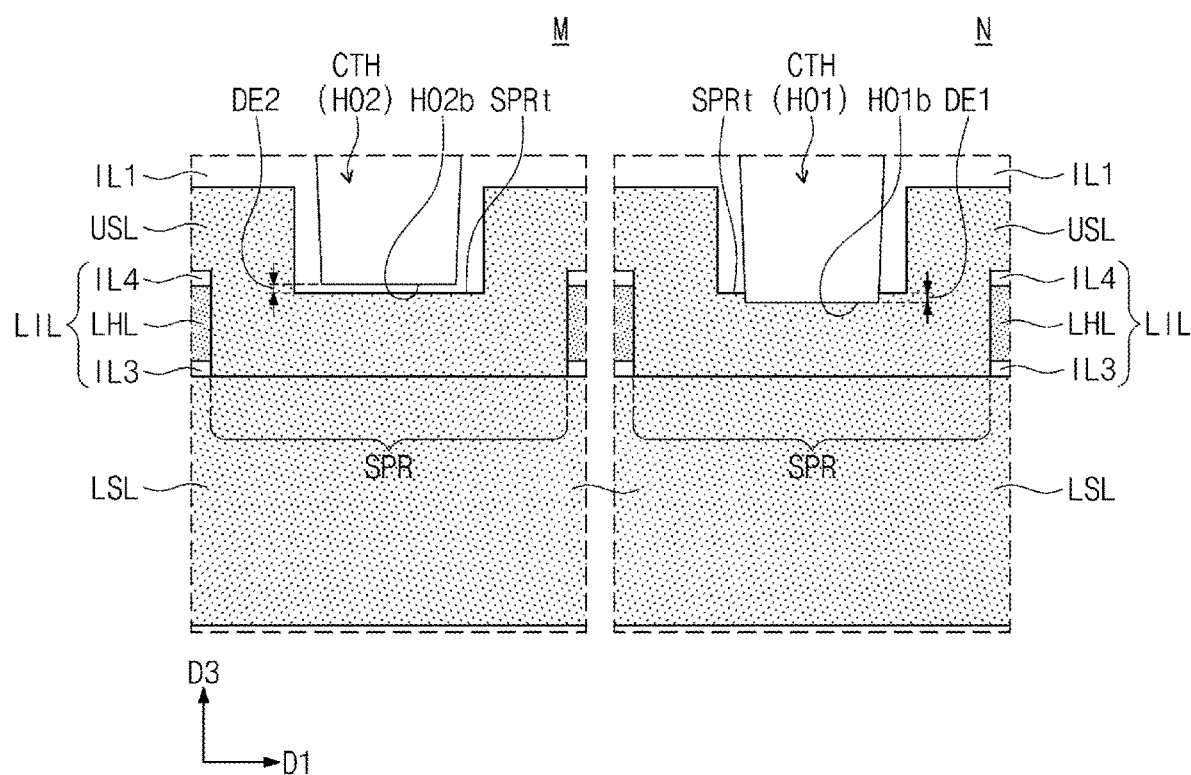
FIGS. 13A, 13B, and 13C are enlarged sectional views illustrating a replacement process of a source horizontal layer (e.g., at the portion M of FIG. 10C and the portion N of FIG. 10D).
Figure 13B:
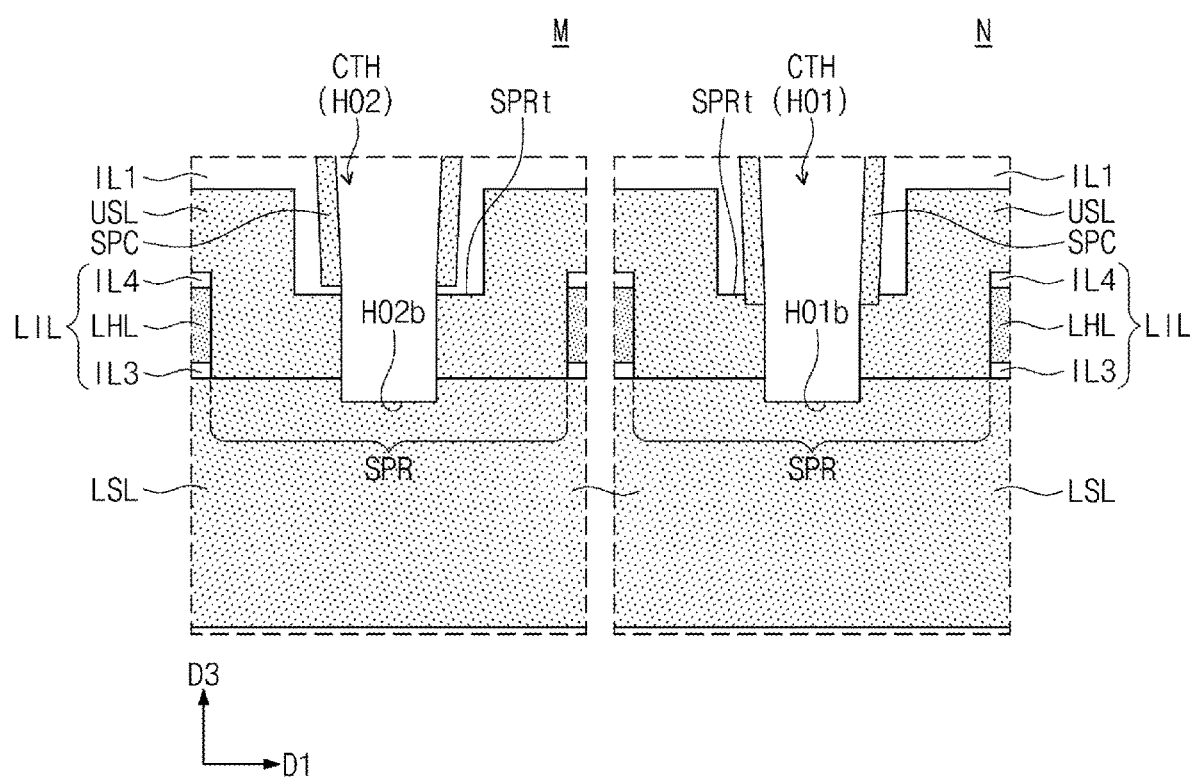
Figure 13C:
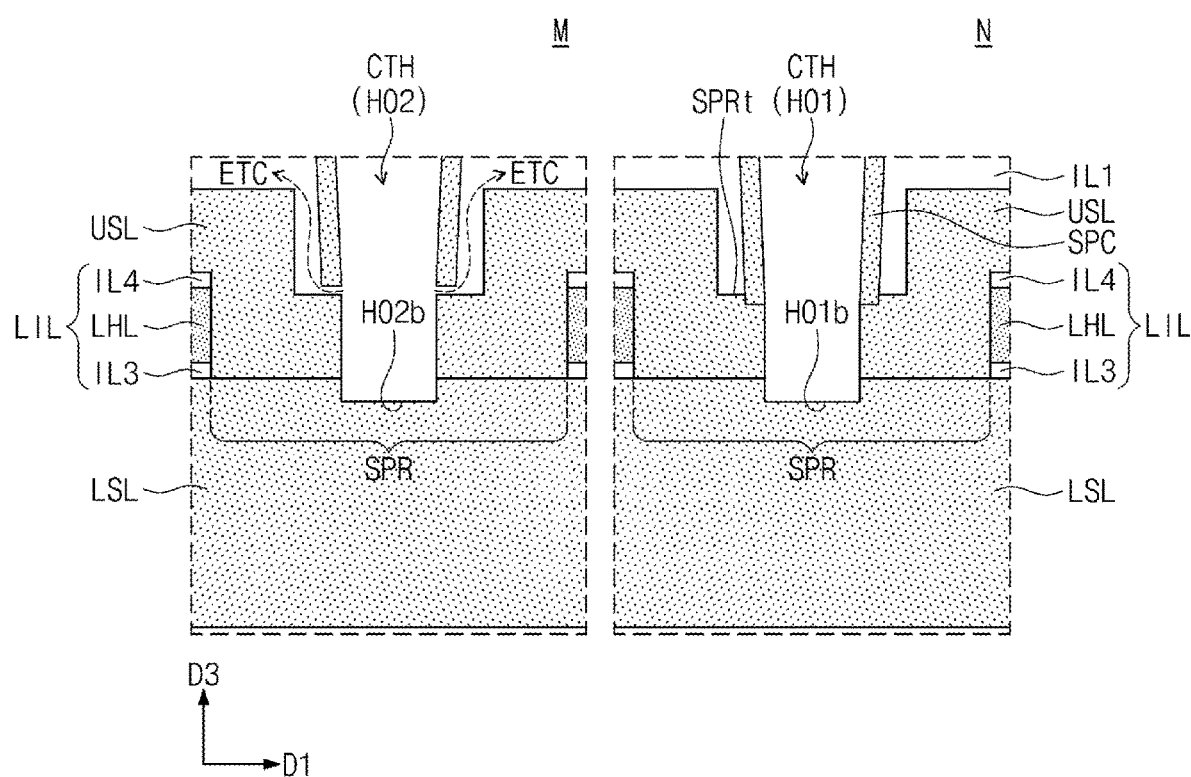

FIGS. 13A, 13B, and 13C are enlarged sectional views illustrating a replacement process of a source horizontal layer (e.g., at the portion M of FIG. 10C and the portion N of FIG. 10D).

Referring to FIGS. 10C, 10D, and 13A, in some instances where the supporting portion SPR is formed to be large in order to improve the structural robustness, the cutting hole CTH may be fully formed on the supporting portion SPR. In other words, both of the first and second holes HO1 and HO2 may be formed on the supporting portion SPR.

Due to a technical limitation which may occur in the patterning process, the second hole HO2, which is located near an end of the cutting hole CTH, may be formed to have a depth smaller than that of the first hole HO1. In other words, the bottom HO2b of the second hole HO2 may be formed at a level that is higher than the top surface SPRt of the supporting portion SPR. For example, the bottom HO2b of the second hole HO2 may be formed to expose just the first insulating layer IL1 of the mold structure MO.

Referring to FIGS. 10C, 10D, and 13B, the spacer SPC may be formed on an inner side surface of each of the first and second holes HO1 and HO2. After the formation of the spacer SPC, an anisotropic etching process may be performed on the cutting hole CTH to further recess the bottom HO1b of the first hole HO1 and the bottom HO2b of the second hole HO2. Here, since the spacer SPC does cover incompletely a side portion of the second hole HO2, at least a portion of the first insulating layer IL1 may be exposed through the uncovered side portion of the second hole HO2.

Referring to FIGS. 10C, 10D, and 13C, a wet etching process may be performed to selectively remove the lower insulating layer LIL. In this case, the first insulating layer IL1 exposed by the second hole HO2 may be in contact with an etchant ETC, which is supplied during the wet etching process, and thus, the first insulating layer IL1 may also be undesirably removed by the process of removing the lower insulating layer LIL. Furthermore, the sacrificial layer HL of the mold structure MO on the first insulating layer IL1 may also be removed by the wet etching process. Such a removal of a lower portion of the mold structure MO may cause serious process failure.

Although, as described above, an increase in area of the supporting portion SPR allows for a robust structure of the device, it may result in an increased possibility of a process failure. According to some embodiments of the inventive concepts, it may be possible to suppress a process failure, even when the supporting portion SPR is formed to have a maximally increased area. In detail, the second hole HO2 of the cutting hole CTH, in which the process failure may be more likely to occur, may be omitted and may not be formed on the supporting portion SPR. By contrast, the first hole HO1 of the cutting hole CTH, in which the process failure may be less likely to occur, may be formed on the supporting portion SPR. Thus, in semiconductor memory devices according to some example embodiments, it may be possible to secure structural robustness and to suppress the process failure, and this may make it still possible to realize semiconductor memory devices with improved reliability.

Figure 14:
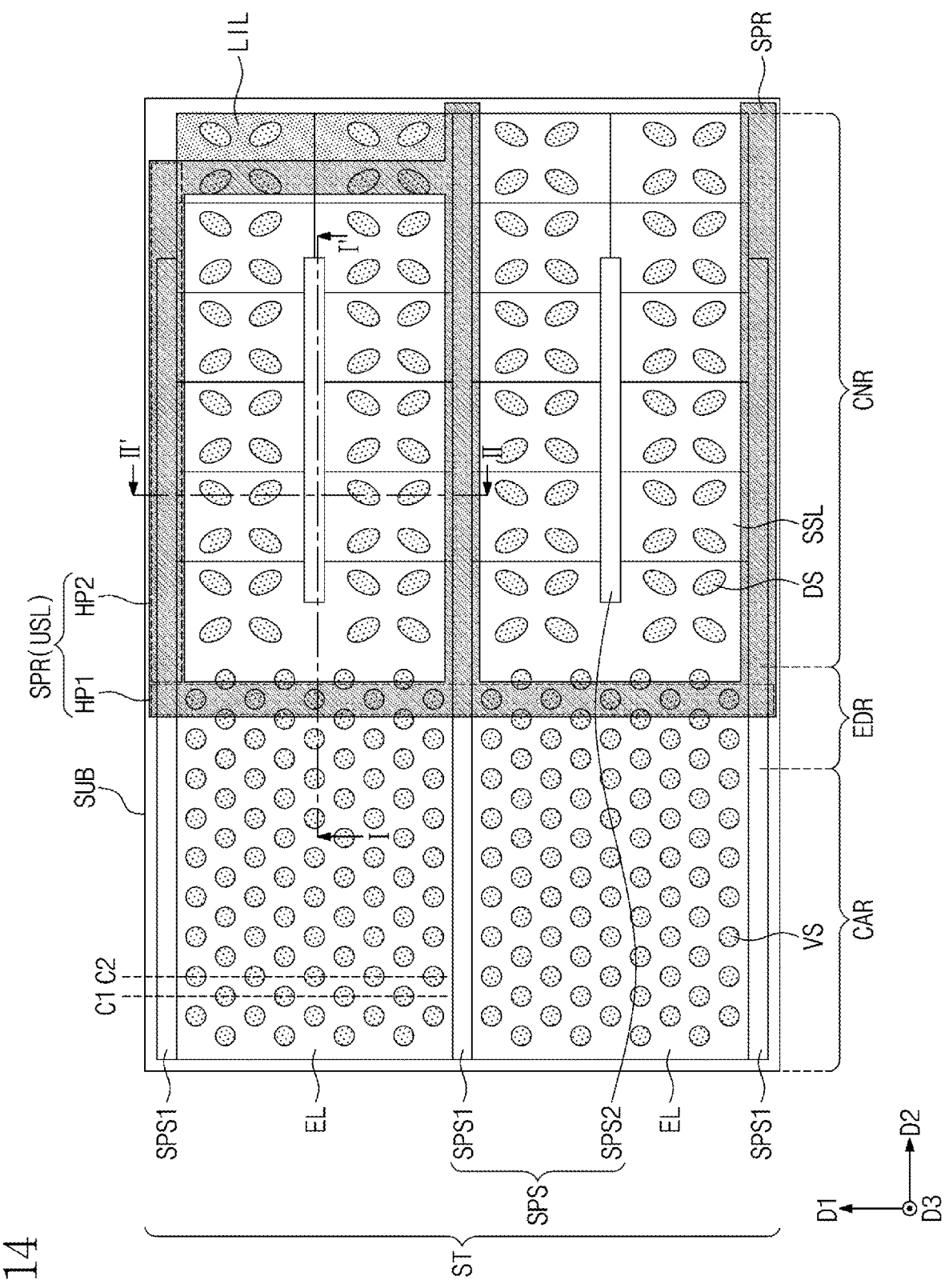
FIG. 14 is a plan view illustrating a semiconductor memory device according to some embodiments of the inventive concepts.
Figure 15A:
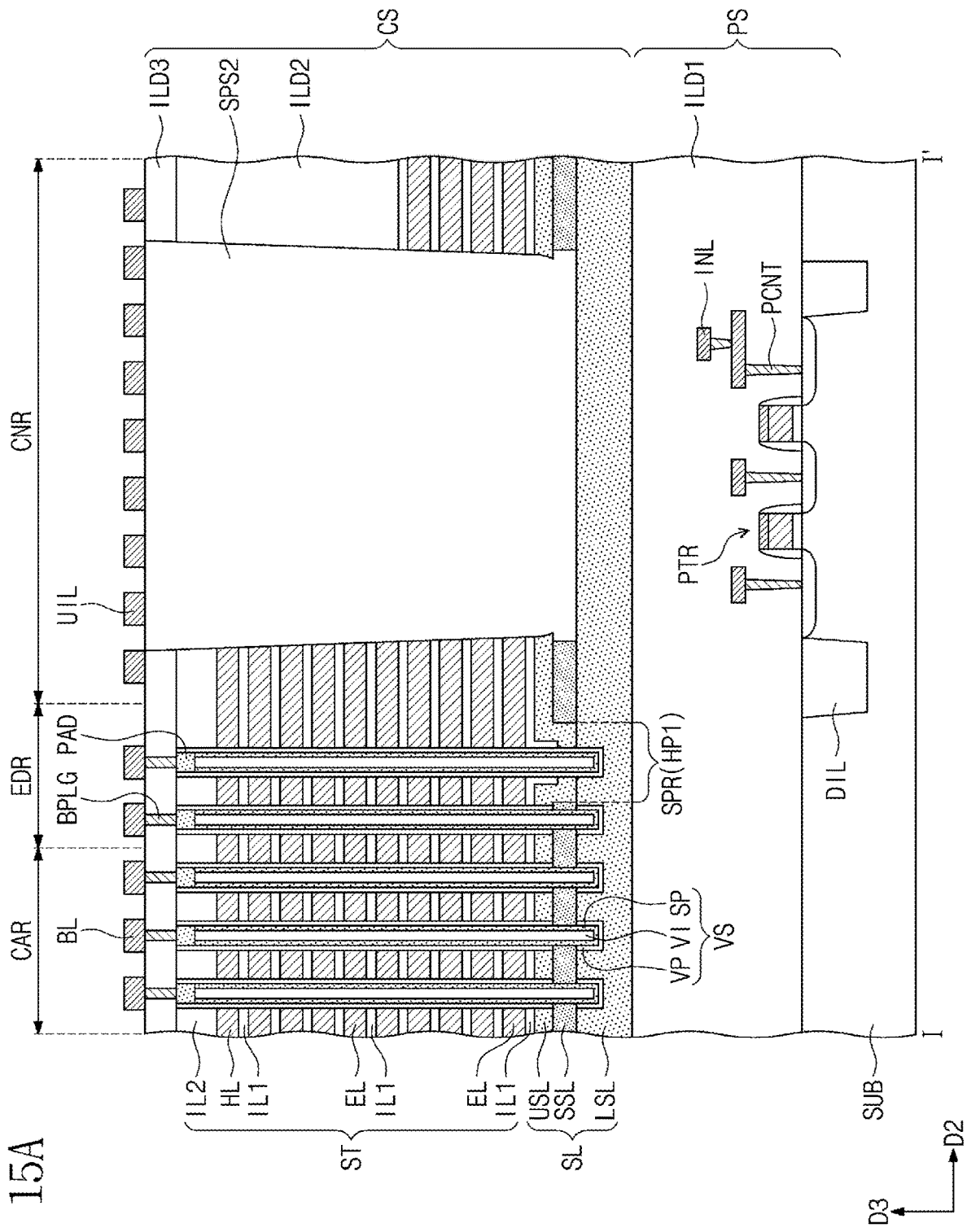
FIGS. 15A and 15B are sectional views taken along lines I-I' and II-II', respectively, of FIG. 14.
Figure 15B:
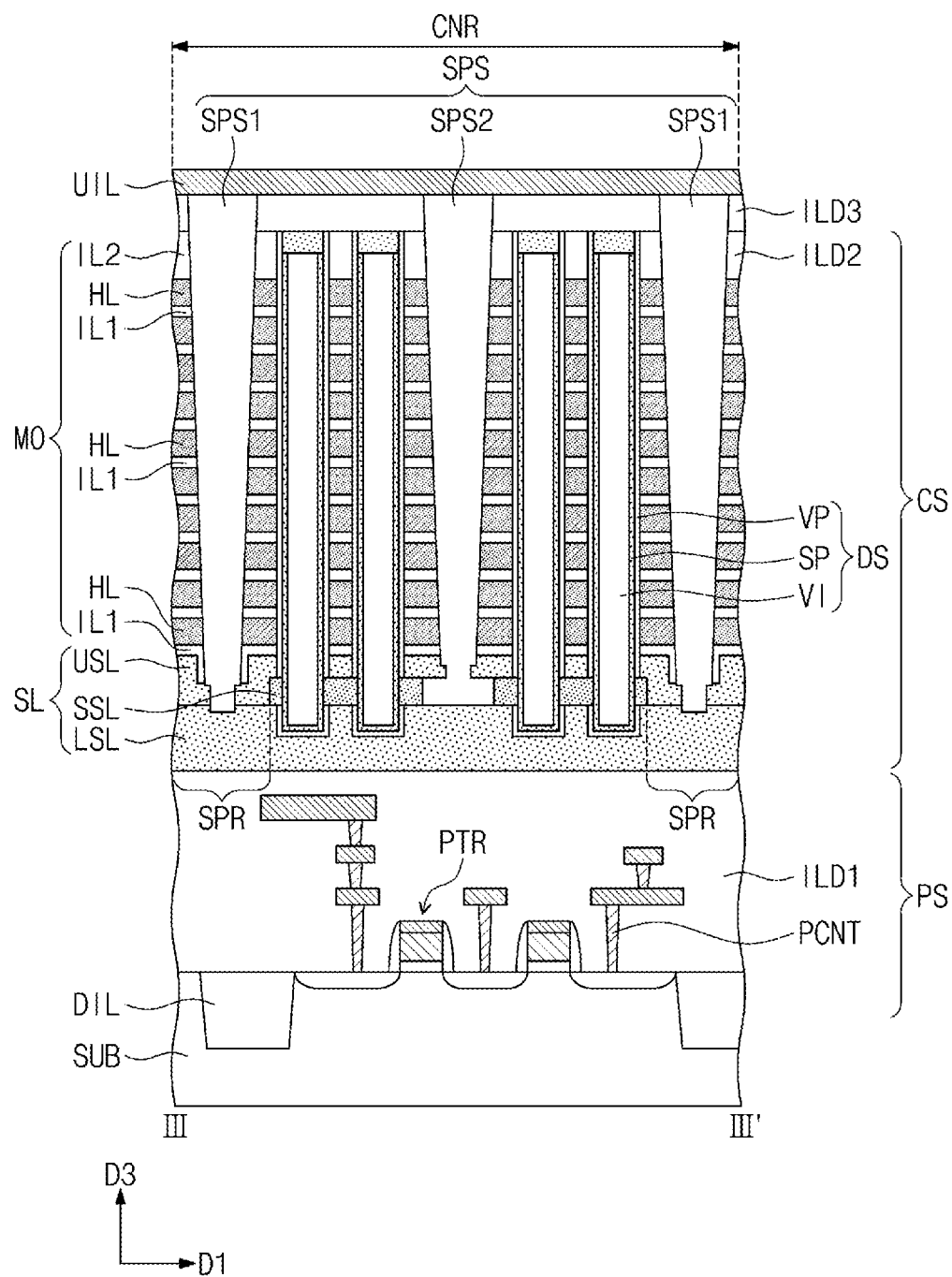

FIG. 14 is a plan view illustrating a semiconductor memory device according to some embodiments of the inventive concepts. FIGS. 15A and 15B are sectional views taken along lines I-I' and II-II', respectively, of FIG. 14. For concise description, elements previously described with reference to FIGS. 3, 4A to 4E, and 5 will be identified by the same reference numbers without repeating overlapping descriptions thereof, and features different from those of the embodiments discussed previously will be described in more detail below.

Referring to FIGS. 14, 15A, and 15B, the second separation structures SPS2 on the connection region CNR may not be overlapped with the supporting portion SPR. That is, the supporting portion SPR of FIG. 14 may have a reduced area, compared with the supporting portion SPR previously described with reference to FIG. 3. However, since the second separation structures SPS2 are spaced apart from the supporting portion SPR, and may be spaced apart from the supporting portion SPR to a sufficient degree, it may be possible to effectively prevent the process failure described with reference to FIGS. 13A to 13C.

Figure 16:
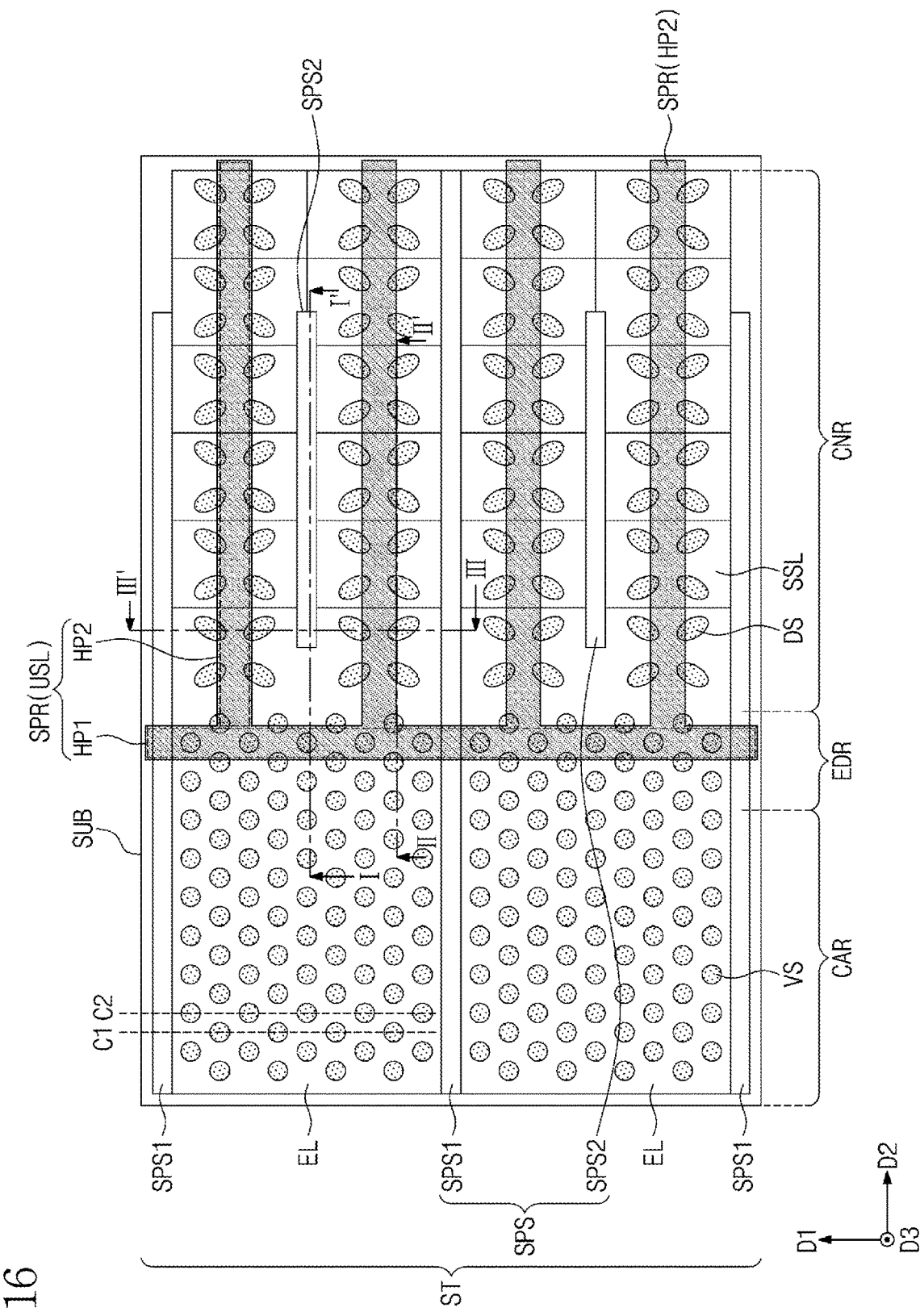
FIG. 16 is a plan view illustrating a semiconductor memory device according to some embodiments of the inventive concepts.
Figure 17A:
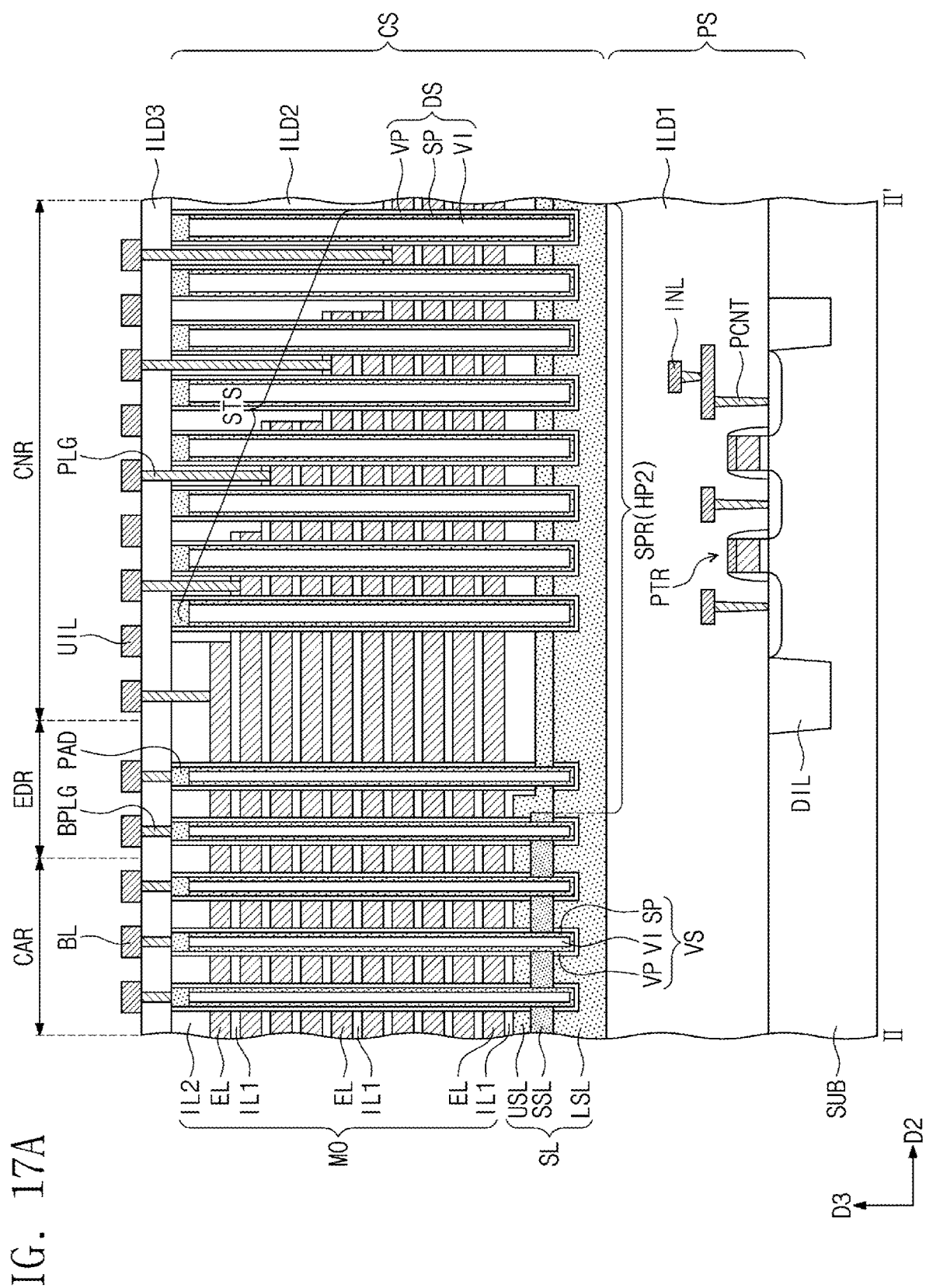
FIGS. 17A and 17B are sectional views taken along lines II-II' and III-III', respectively, of FIG. 16.
Figure 17B:
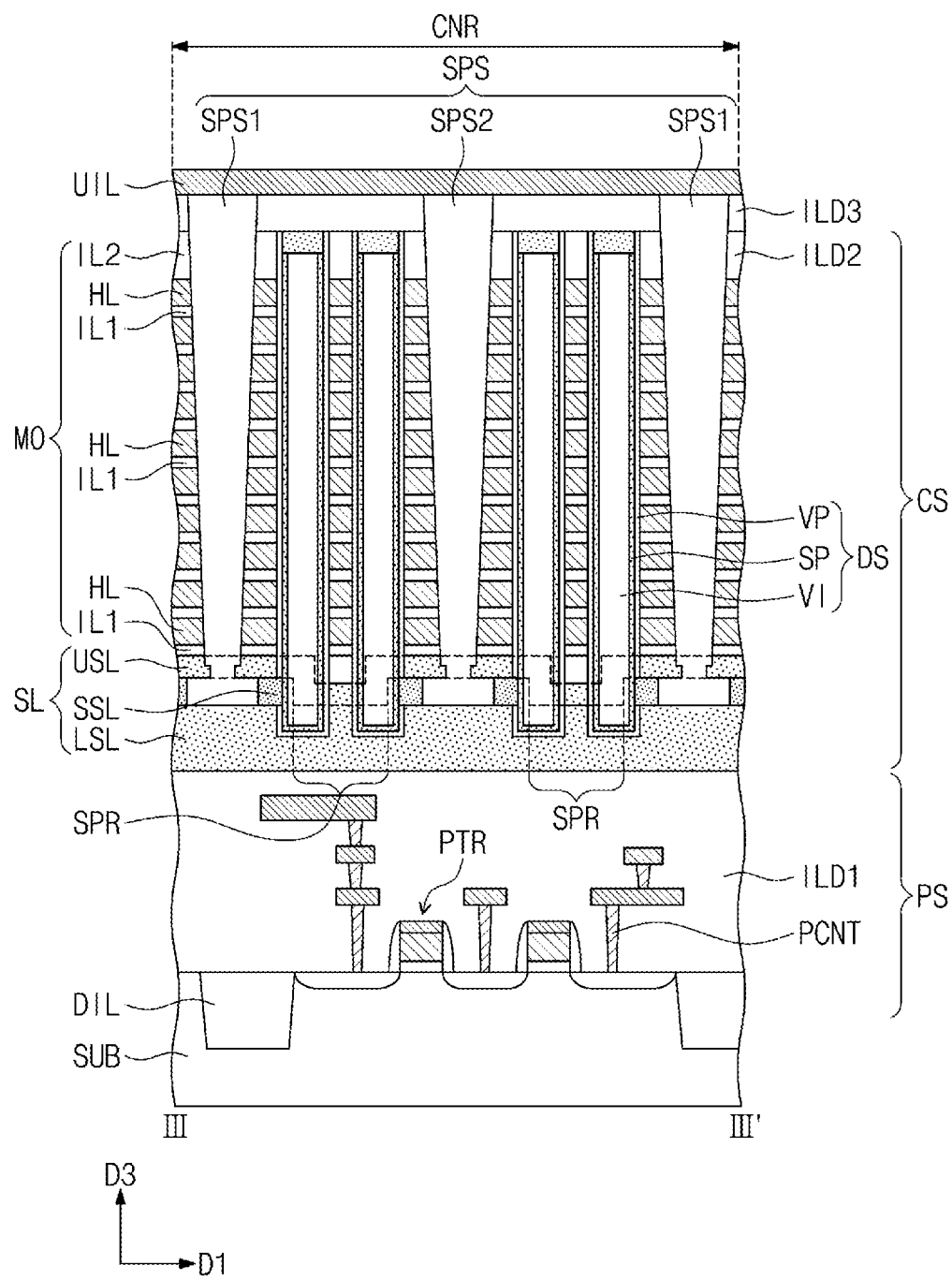

FIG. 16 is a plan view illustrating a semiconductor memory device according to some embodiments of the inventive concepts. FIGS. 17A and 17B are sectional views taken along lines II-II' and III-III', respectively, of FIG. 16. Reference is also made to FIG. 15A, which is a sectional view taken along a line I-I' of FIG. 16. For concise description, elements previously described with reference to FIGS. 3, 4A to 4E, and 5 will be identified by the same reference numbers without repeating overlapping descriptions thereof, and features different from those of the embodiments discussed previously will be described in more detail below.

Referring to FIGS. 16, 17A, and 17B, the second horizontal extended portions HP2 of the supporting portion SPR may not be overlapped with the separation structures SPS. In other words, on the connection region CNR, the second horizontal extended portions HP2 and the separation structures SPS may be alternately arranged in the first direction D1. Since the separation structures SPS are spaced apart from the supporting portion SPR, and may be spaced apart from the supporting portion SPR by a sufficient degree, it may be possible to effectively prevent the process failure described with reference to FIGS. 13A to 13C.

At least one dummy structure DS may be provided to penetrate the second horizontal extended portion HP2 of the supporting portion SPR. In some embodiments, the supporting portion SPR may be interposed between an adjacent pair of the dummy structures DS.

Figure 18A:
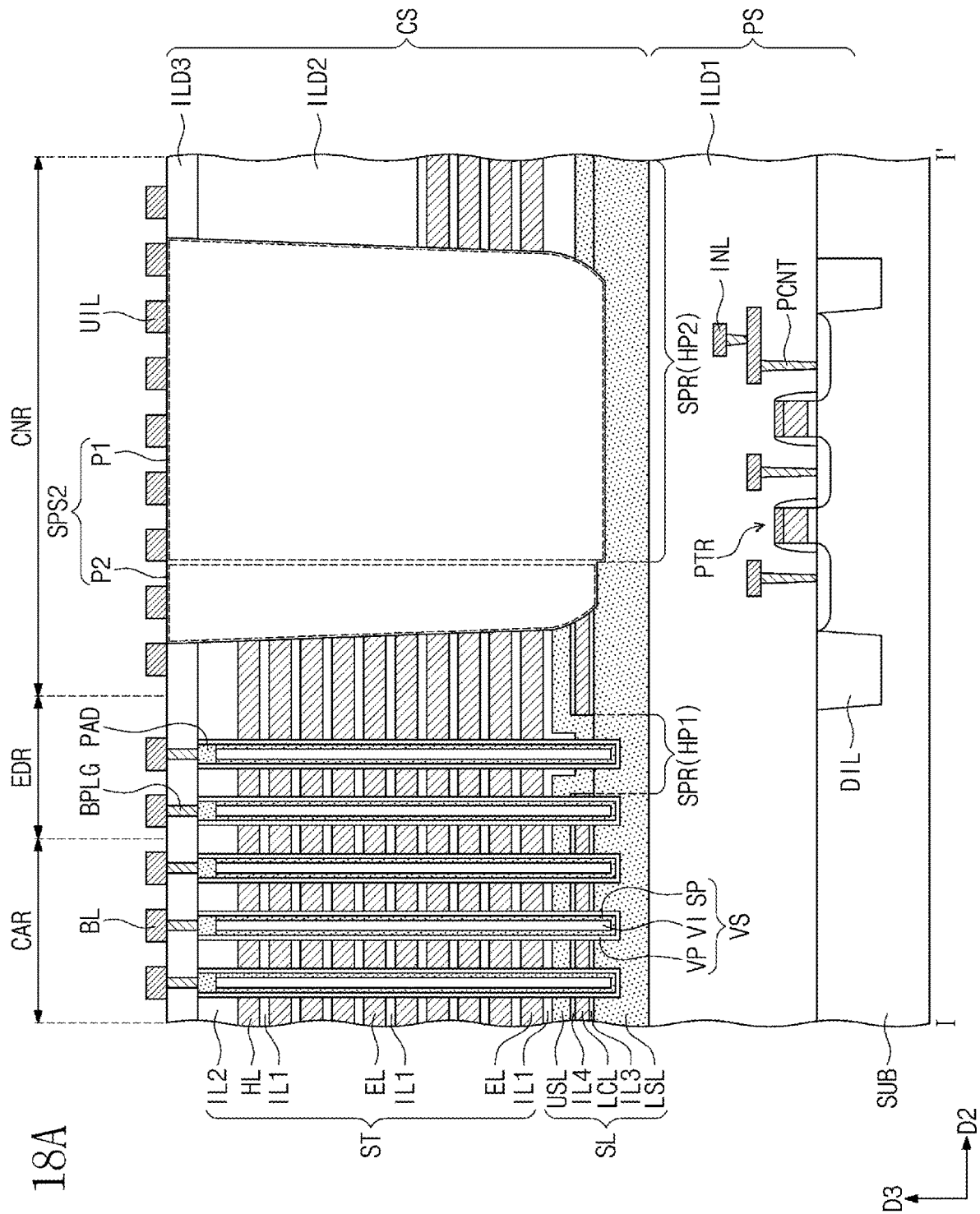
FIGS. 18A and 18B are sectional views, which are respectively taken along the lines I-I' and III-III' of FIG. 3 to illustrate a semiconductor memory device according to some embodiments of the inventive concepts.
Figure 18B:
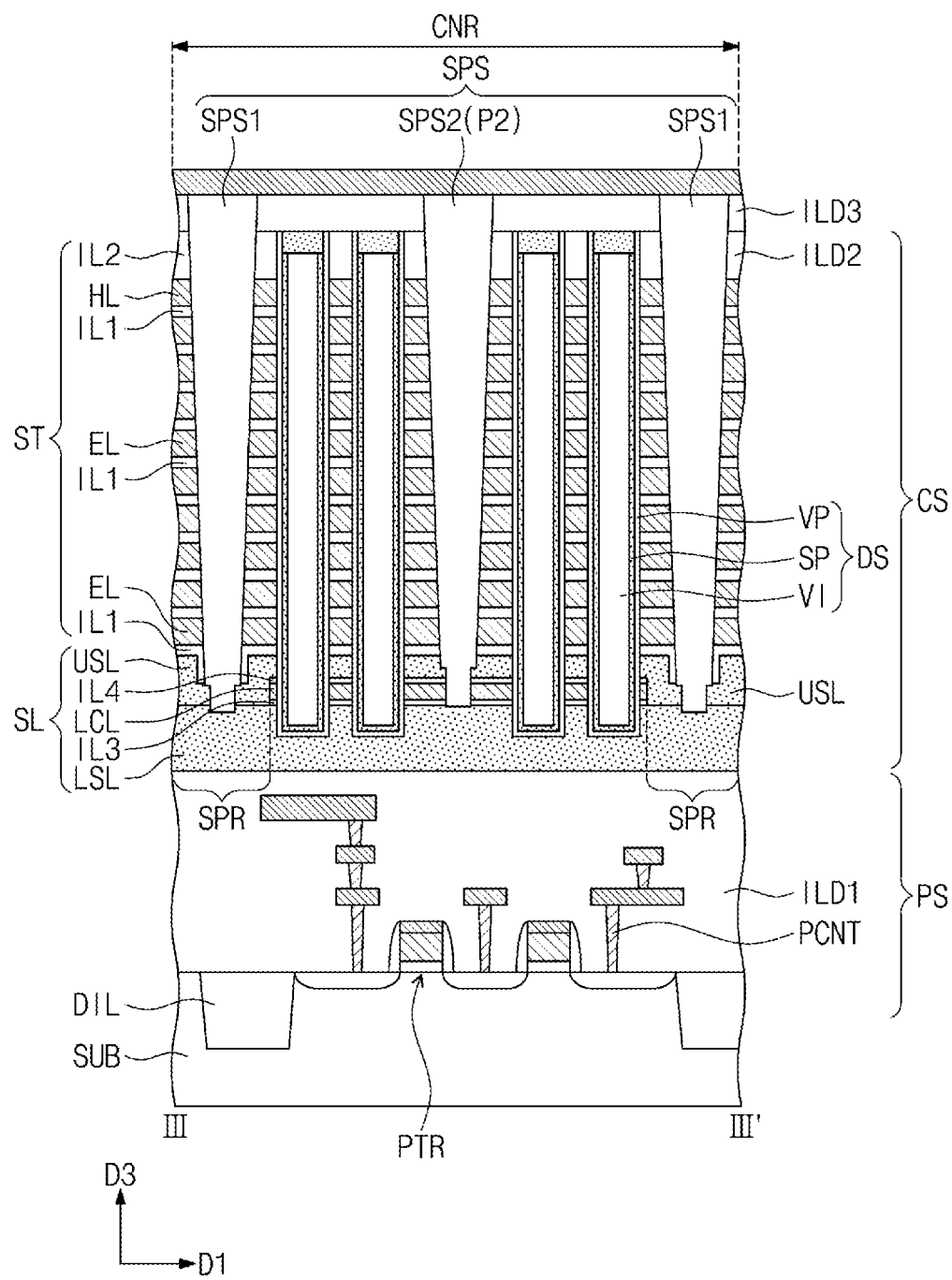

FIGS. 18A and 18B are sectional views, which are respectively taken along the lines I-I' and III-III' of FIG. 3 to illustrate a semiconductor memory device according to some embodiments of the inventive concepts. For concise description, elements previously described with reference to FIGS. 3, 4A to 4E, and 5 will be identified by the same reference numbers without repeating overlapping descriptions thereof, and features different from those of the embodiments discussed previously will be described in more detail below.

Referring to FIGS. 3, 18A, and 18B, a bottom surface of the second portion P2 of the second separation structure SPS2 may be lower than the top surface of the lower horizontal layer LSL. The third insulating layer IL3, a lower conductive layer LCL, and the fourth insulating layer IL4 may be sequentially stacked on the connection region CNR to be interposed between the lower and upper horizontal layers LSL and USL. The lower conductive layer LCL may be formed of or include the same material as the electrode EL of the electrode structure ST.

Referring to FIG. 18B, at least one dummy structure DS may be provided to penetrate the lower conductive layer LCL. The lower conductive layer LCL may be interposed between an adjacent pair of the dummy structures DS.

The second hole HO2 of the cutting hole CTH previously described with reference to FIG. 10C may be over-etched to have a bottom that is recessed to a level lower than the top surface of the lower horizontal layer LSL. The spacer SPC in the second hole HO2 may be formed to cover the lower insulating layer LIL. In this case, the lower insulating layer LIL may not be removed through the second hole HO2 in a subsequent process. Thereafter, the remaining lower insulating layer LIL may be replaced with the lower conductive layer LCL through a process of replacing the sacrificial layers HL with the electrodes EL.

In semiconductor memory devices according to example embodiments of the inventive concepts, a supporting portion of a source horizontal layer may be provided to improve structural stability of the semiconductor memory device. Furthermore, a separation structure may be formed to have at least a portion that is not overlapped with the supporting portion, and in this case, it may be possible to prevent process failures and/or to improve reliability of the semiconductor memory devices.

While example embodiments of the inventive concepts have been particularly shown and described, it will be understood by one of ordinary skill in the art that variations in form and detail may be made therein without departing from the scope of the attached claims.

What is claimed is:

1. A semiconductor memory device, comprising:
   a substrate including a first layer, a second layer, and a third layer that are sequentially stacked;
   an electrode structure including electrodes that are stacked above the substrate;
   a vertical channel structure that penetrates the electrode structure and is connected to the substrate; and
   a separation structure that is at least partially on the substrate and that penetrates the electrode structure and divides the electrode structure,
   wherein the separation structure includes:
      a first vertical extended portion between a pair of lowermost electrodes of the electrodes that are adjacent to each other;
      a second vertical extended portion under the first vertical extended portion; and
      a neck portion interposed between the first vertical extended portion and the second vertical extended portion,
   wherein the neck portion is located in the third layer,
   wherein the second vertical extended portion extends horizontally in the second layer,
   wherein a first width of the first vertical extended portion is smaller than a second width of the second vertical extended portion, and
   wherein a bottom surface of the second vertical extended portion is higher than a bottom surface of the vertical channel structure.

2. The semiconductor memory device of claim 1, further comprising a dummy structure that penetrates the electrode structure,
   wherein the substrate has a cell array region and a connection region,
   wherein a portion of the electrode structure and a portion of the separation structure extend over the cell array region and over the connection region,
   wherein a portion of the vertical channel structure is provided on the cell array region, and
   wherein a portion of the dummy structure is provided on the connection region.

3. The semiconductor memory device of claim 2, wherein the vertical channel structure includes a first vertical semiconductor pattern and a first vertical insulating pattern that covers an outer surface of the first vertical semiconductor pattern, and
   wherein the dummy structure includes a second vertical semiconductor pattern and a second vertical insulating pattern that covers an outer surface of the second vertical semiconductor pattern.

4. The semiconductor memory device of claim 1, wherein a third width of the neck portion is smaller than the first width.

5. The semiconductor memory device of claim 1, wherein the separation structure has an inflection point at which a width of the separation structure is changed abruptly between the neck portion and the second vertical extended portion.

6. The semiconductor memory device of claim 1, wherein the vertical channel structure includes a first vertical semiconductor pattern and a first vertical insulating pattern that covers an outer surface of the first vertical semiconductor pattern, and wherein the second layer directly contacts the first vertical semiconductor pattern of the vertical channel structure.

7. The semiconductor memory device of claim 1, further comprising:
   a bit line electrically connected to the vertical channel structure;
   an upper interconnection line electrically connected to the electrode structure; and
   a peripheral circuit structure below the substrate,
   wherein the bit line and the upper interconnection line are electrically connected to the peripheral circuit structure.

8. A semiconductor memory device, comprising:
   a substrate including a first layer, a second layer, and a third layer that are sequentially stacked;
   a first electrode structure and a second electrode structure adjacent to the first electrode structure, each of the first and second electrode structures including electrodes that are stacked above the substrate;
   a first vertical channel structure that penetrates the first electrode structure and is connected to the substrate;
   a second vertical channel structure that penetrates the second electrode structure and is connected to the substrate; and
   a separation structure between the first and second electrode structures,
   wherein the separation structure vertically extends from top surfaces of the first and second electrode structures toward the second layer,
   wherein the separation structure includes:
      a first vertical extended portion interposed between lower portions of the first and second electrode structures;
      a second vertical extended portion under the first vertical extended portion; and
      a neck portion interposed between the first vertical extended portion and the second vertical extended portion,
   wherein the neck portion is located in the third layer,
   wherein the second vertical extended portion extends horizontally in the second layer,
   wherein a first width of the first vertical extended portion is smaller than a second width of the second vertical extended portion, and
   wherein a bottom surface of the second vertical extended portion is higher than a bottom surface of each of the first and second vertical channel structures.

9. The semiconductor memory device of claim 8, further comprising a dummy structure that penetrates the first electrode structure,
   wherein the substrate has a cell array region and a connection region,
   wherein portions of the first and second electrode structures and a portion of the separation structure extend above the cell array region and above the connection region, wherein portions of the first and second vertical channel structures are provided on the cell array region, and wherein a portion of the dummy structure is provided on the connection region.

10. The semiconductor memory device of claim 9, wherein each of the first and second vertical channel structures includes a first vertical semiconductor pattern and a first vertical insulating pattern that covers an outer surface of the first vertical semiconductor pattern, and wherein the dummy structure includes a second vertical semiconductor pattern and a second vertical insulating pattern that covers an outer surface of the second vertical semiconductor pattern.

11. The semiconductor memory device of claim 9, wherein a third width of the neck portion is smaller than the first width.

12. The semiconductor memory device of claim 9, wherein the separation structure has an inflection point at which a width of the separation structure is changed abruptly between the neck portion and the second vertical extended portion.

13. The semiconductor memory device of claim 8, wherein each of the first and second vertical channel structures includes a first vertical semiconductor pattern and a first vertical insulating pattern that covers an outer surface of the first vertical semiconductor pattern, and wherein the second layer directly contacts the first vertical semiconductor patterns of the first and second vertical channel structures.

14. The semiconductor memory device of claim 8, further comprising:

a first bit line and a second bit line that are electrically connected to the first vertical channel structure and the second vertical channel structure, respectively;

a first upper interconnection line and a second upper interconnection line that are electrically connected to the first electrode structure and the second electrode structure, respectively; and a peripheral circuit structure below the substrate, wherein the first and second bit lines and the first and second upper interconnection lines are electrically connected to the peripheral circuit structure.

* * * * *